US012707920B2

(12) United States Patent
Inagi et al.

(10) Patent No.: US 12,707,920 B2
(45) Date of Patent: *Aug. 11, 2026

(54) PROCESSING CONDITION SPECIFYING METHOD, SUBSTRATE PROCESSING METHOD, SUBSTRATE PRODUCT PRODUCTION METHOD, COMPUTER PROGRAM, STORAGE MEDIUM, PROCESSING CONDITION SPECIFYING DEVICE, AND SUBSTRATE PROCESSING APPARATUS

(71) Applicant: SCREEN HOLDINGS CO., LTD., Kyoto (JP)

(72) Inventors: Dai Inagi, Kyoto (JP); Tatsuya Shimano, Kyoto (JP); Takashi Ota, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 979 days.

This patent is subject to a terminal disclaimer.

(21) Appl. No.: 17/793,573

(22) PCT Filed: Nov. 25, 2020

(86) PCT No.: PCT/JP2020/043838

§ 371 (c)(1),
(2) Date: Jul. 18, 2022

(87) PCT Pub. No.: WO2021/152983

PCT Pub. Date: Aug. 5, 2021

(65) Prior Publication Data

US 2023/0053059 A1 Feb. 16, 2023

(30) Foreign Application Priority Data

Jan. 30, 2020 (JP) ................................ 2020-013777

(51) Int. Cl.

*H01L 21/67* (2006.01)
*H10P 50/64* (2026.01)
*H10P 72/00* (2026.01)

(52) U.S. Cl.

CPC ........ *H10P 72/0604* (2026.01); *H10P 50/642* (2026.01); *H10P 72/0422* (2026.01); *H10P 72/0616* (2026.01)

(58) Field of Classification Search

CPC .... H10B 12/488; H10B 12/02; H10B 12/056; H10P 72/0604; H10P 50/642; H10P 72/0422; H10P 72/0616

See application file for complete search history.

(56) References Cited

U.S. PATENT DOCUMENTS 5,503,707 A 4/1996 Maung et al. ............. 156/643.1
9,870,928 B2 1/2018 Goldberg et al.

(Continued)

FOREIGN PATENT DOCUMENTS

CN 207120113 U 3/2018
JP 2004-071862 A 3/2004

(Continued)

OTHER PUBLICATIONS

J. Gu et al 1995 J. Electrochem. Soc. 142 907 (Year: 1995).*

(Continued)

*Primary Examiner* — Jarrett J Stark
(74) *Attorney, Agent, or Firm* — OSTROLENK FABER LLP

(57) ABSTRACT

A processing condition specifying method that includes Steps S31, S32, and S33. In Step S31, a prediction thickness information piece containing prediction values of thicknesses after processing on the substrate W is calculated for each of a plurality of recipe information pieces based on measurement thickness information containing measure- (Continued)

ment values of thicknesses of the substrate W. In Step S32, the prediction thickness information pieces each calculated for a corresponding one of the recipe information pieces are evaluated according to a prescribed evaluation method and a prediction thickness information piece is selected from among the prediction thickness information pieces. In Step S33, a recipe information piece corresponding to the selected prediction thickness information piece is specified. The measurement values contained in the measurement thickness information indicate a thickness of the substrate W measured before processing on the substrate W.

12 Claims, 14 Drawing Sheets

(56) References Cited

U.S. PATENT DOCUMENTS 10,026,660 B2 7/2018 Mauer et al.
10,325,787 B2 6/2019 Hayashi et al.
10,553,502 B2 2/2020 Mauer et al.
10,589,305 B2 3/2020 Takahashi
10,651,064 B2 5/2020 Naohara et al.
10,705,514 B2 7/2020 Banna
10,955,832 B2 3/2021 Banna
11,237,544 B2 2/2022 Moki et al.
11,289,313 B2 3/2022 Umeda et al.
11,393,084 B2 7/2022 Ishikawa et al.
11,619,926 B2 4/2023 Moki et al.
11,657,059 B2 5/2023 Okuyama et al.
11,907,235 B2 2/2024 Okuyama et al.
12,322,600 B2 * 6/2025 Naohara ........... H01L 21/30604
2003/0185560 A1 10/2003 Sanada et al.
2005/0000940 A1 * 1/2005 Iwamoto ............... H10P 50/283 257/E21.251
2005/0087298 A1 4/2005 Tanaka et al.
2007/0175863 A1 * 8/2007 Koyata ............... H10P 72/0424 216/84
2007/0238201 A1 10/2007 Funk et al. ..................... 438/14
2012/0247505 A1 10/2012 Brown et al.
2013/0204416 A1 8/2013 Takashi et al.
2014/0240486 A1 8/2014 Okada et al.
2016/0071746 A1 3/2016 Hayashi
2016/0089688 A1 3/2016 Uemae et al.
2016/0126148 A1 5/2016 Mauer et al.
2016/0126150 A1 5/2016 Goldberg et al.
2016/0155647 A1 6/2016 Brown et al.
2017/0372232 A1 12/2017 Maughan et al.
2018/0294196 A1 10/2018 Mauer et al.
2018/0306442 A1 10/2018 Vitt et al.
2019/0096720 A1 3/2019 Naohara et al.
2019/0181025 A1 6/2019 Ota et al.
2019/0240799 A1 8/2019 Takeda et al.
2019/0315066 A1 10/2019 Maeda
2020/0006100 A1 1/2020 Clark et al.
2020/0043764 A1 2/2020 Clark et al.
2020/0166909 A1 5/2020 Noone et al.
2020/0411346 A1 12/2020 Oh et al.
2021/0004723 A1 1/2021 Kanno
2021/0042570 A1 2/2021 Iskandar et al.
2021/0125104 A1 4/2021 Christiansen et al.
2021/0157237 A1 5/2021 Hayashi et al.
2021/0166120 A1 6/2021 Tsutsui
2021/0240741 A1 8/2021 Naohara et al.
2021/0287080 A1 9/2021 Moloney
2021/0303741 A1 * 9/2021 Burns ..................... G06F 30/10
2021/0312610 A1 10/2021 Tanaka et al.
2022/0336615 A1 * 10/2022 Chiu ...................... H10B 10/00
2023/0161301 A1 5/2023 Ano et al.
2023/0162484 A1 5/2023 Ryu et al.
2023/0177393 A1 6/2023 Tsuchida
2023/0222131 A1 7/2023 Okuyama et al.
2023/0288921 A1 9/2023 Kuroda
2023/0306281 A1 9/2023 Han et al.
2023/0333482 A1 10/2023 Hubaux et al.
2024/0203765 A1 6/2024 Ota et al.

FOREIGN PATENT DOCUMENTS

JP 2006-151779 A 6/2006
JP 2007-173334 A 7/2007
JP 2010-067819 A 3/2010
JP 2010-239014 A 10/2010
JP 2012-212744 A 11/2012
JP 2016-122681 A 7/2016
JP 2018-138308 A 9/2018
JP 2018-147908 A 9/2018
JP 2019-009416 A 1/2019
JP 2019-054104 A 4/2019
JP 2019-062007 A 4/2019
JP 2019-106476 A 6/2019
JP 6525044 B1 6/2019
JP 2019-159864 A 9/2019
JP 2020-004817 A 1/2020
JP 2020-038888 A 3/2020
JP 2020-093468 A 6/2020
JP 2020-104216 A 7/2020
JP 2020-150198 A 9/2020
KR 10-2015-0119186 A 10/2015
KR 10-2019-0087940 A 7/2019
KR 10-2020-0118030 A 10/2020
KR 10-2021-0001493 A 1/2021
KR 10-2021-0030447 A 3/2021
KR 10-2021-0055105 A 5/2021
KR 10-2021-0066897 A 6/2021
KR 10-2021-0092238 A 7/2021
TW 2007-41810 A 11/2007
TW 201246354 A 11/2012
TW 2016-15905 A 5/2016
TW 201703111 A 1/2017
TW 201832872 A 9/2018
TW 201946177 A 12/2019
WO WO 2018/033890 A1 2/2018
WO WO 2018/074091 A1 4/2018
WO WO 2019/198143 A1 10/2019
WO WO 2019/202962 A1 10/2019
WO WO 2020/105517 A1 5/2020

OTHER PUBLICATIONS

Office Action mailed Dec. 22, 2023, issued in corresponding Korean Patent Application No. 10-2022-7028929.
International Search Report mailed Jan. 26, 2021 in corresponding PCT International Application No. PCT/JP2020/043838.
Written Opinion mailed Jan. 26, 2021 in corresponding PCT International Application No. PCT/JP2020/043838.
He Zixing et al.: "Prediction and Control of Machining Errors in Equidistant Surfaces," Mining Machinery Magazine, vol. 6, pp. 59-61, Jun. 10, 1998 and its English machine translation.

* cited by examiner

| | | Processing amount (μm) | | | |
|---|---|---|---|---|---|
| Nozzle | Point(mm) / Recipe | 0 | 1 | | R |
| NZ1 | RC1 | a1 | a2 | ··· | aJ |
| | RC2 | b1 | b2 | ··· | bJ |
| | ⋮ | ⋮ | ⋮ | ⋮ | ⋮ |
| NZ2 | RC11 | c1 | c2 | ··· | cJ |
| | RC12 | d1 | d2 | ··· | dJ |
| | ⋮ | ⋮ | ⋮ | ⋮ | ⋮ |

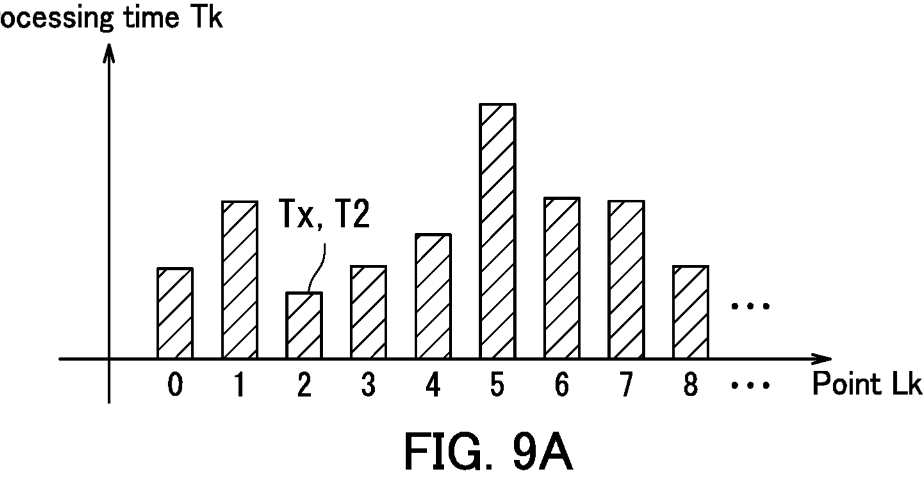
FIG. 9A
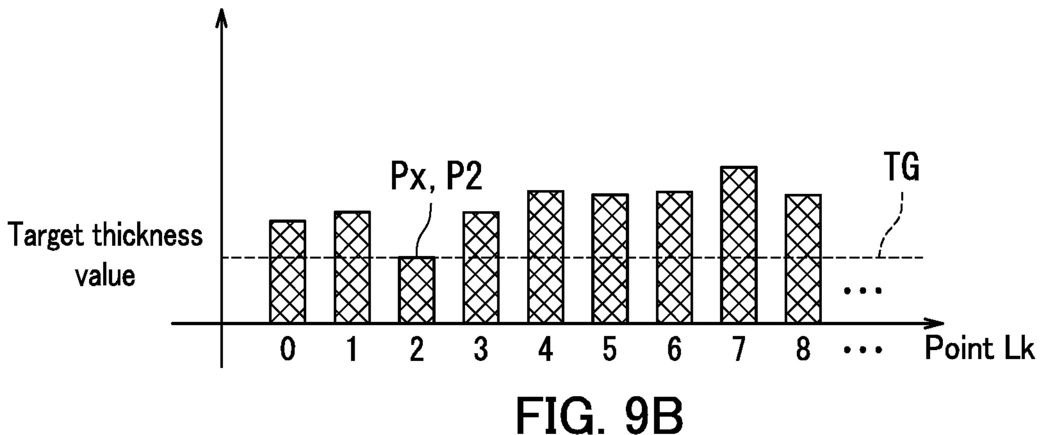
FIG. 9B
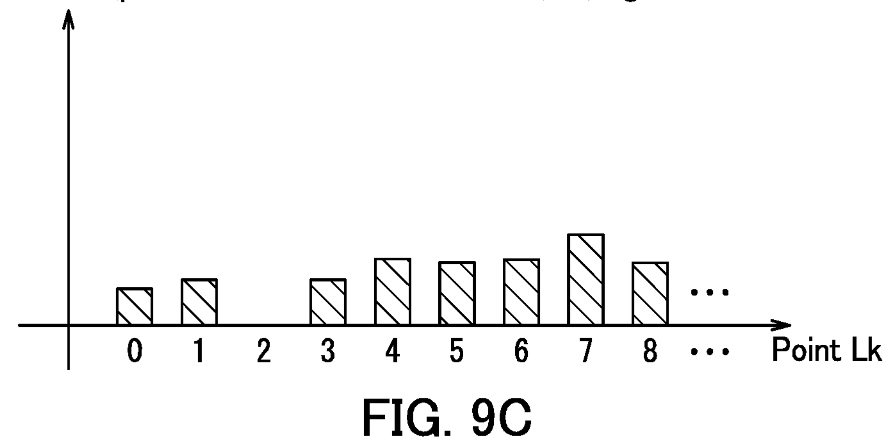
FIG. 9C

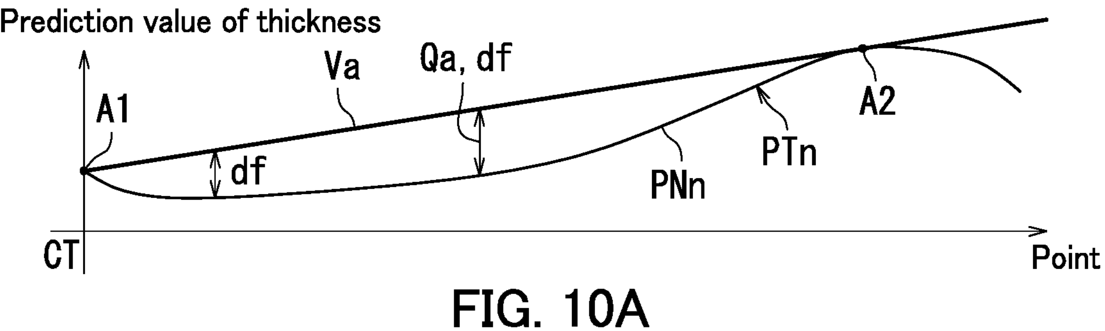
FIG. 10A
Prediction value of thickness
PTn
Qb, df
PNn
A3
df
A4
Vb
CT
Point
FIG. 10B
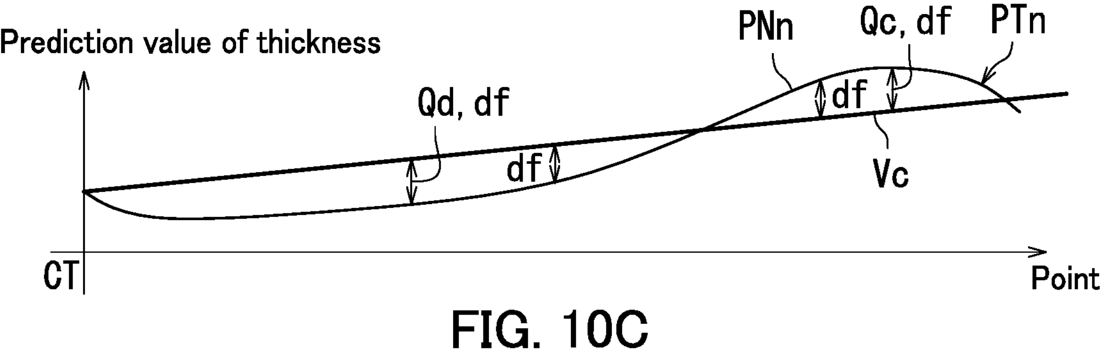
FIG. 10C
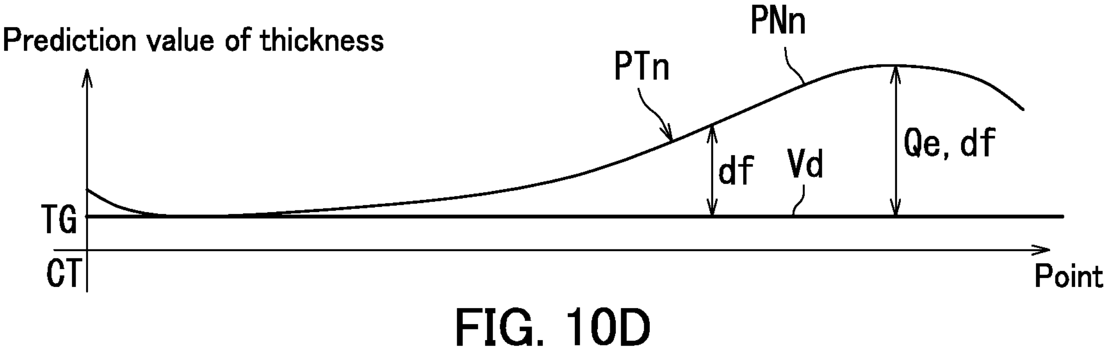
FIG. 10D

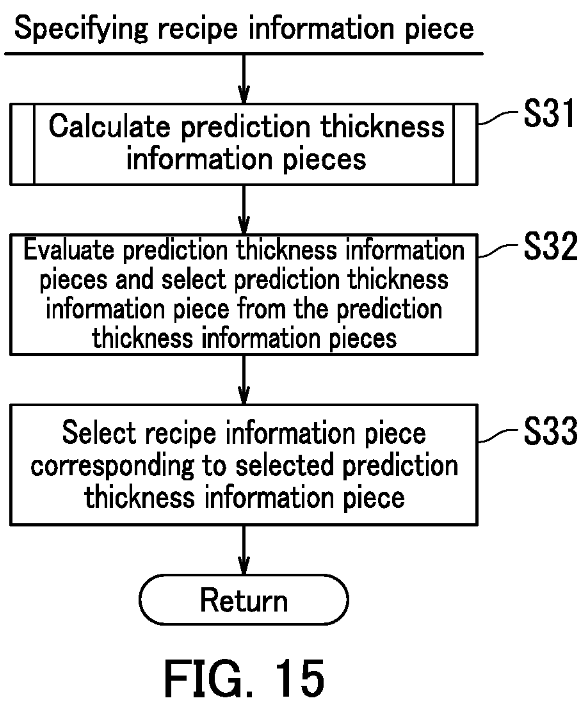

FIG. 15

Calculating prediction thickness information pieces

Calculate for each point on substrate processing time when thickness reaches target thickness value based on prediction thickness information piece of substrate, target thickness value, and actually measured processing amount information piece

S311

Select shortest processing time from among processing times

S312

Calculate prediction thickness information piece based on measurement thickness information of substrate, actually measured processing amount information piece, and shortest processing time

S313

Done for every actually measured processing amount information piece?

S314

No

Yes

Return

FIG. 16

PROCESSING CONDITION SPECIFYING METHOD, SUBSTRATE PROCESSING METHOD, SUBSTRATE PRODUCT PRODUCTION METHOD, COMPUTER PROGRAM, STORAGE MEDIUM, PROCESSING CONDITION SPECIFYING DEVICE, AND SUBSTRATE PROCESSING APPARATUS

CROSS-REFERENCE TO RELATED APPLICATIONS

The present application is a 35 U.S.C. §§ 371 national stage application of International Application No. PCT/JP2020/043838, filed Nov. 25, 2020, which claims priority to Japanese Patent Application No. 2020-013777, filed Jan. 30, 2020, the contents of both of which are incorporated herein by reference.

TECHNICAL FIELD

The present invention relates to a processing condition specifying method, a substrate processing method, a substrate product production method, a computer program, a storage medium, a processing condition specifying device, and a substrate processing apparatus.

BACKGROUND ART

A substrate processing apparatus disclosed in Patent Literature 1 includes a controller and an arm including a nozzle body. The controller the moving speed of the arm gradually increases when the nozzle body moves toward the central part from the peripheral part of a substrate and gradually decreases when the nozzle body moves toward the peripheral part from the central part thereof. In the above configuration, a larger amount of a processing liquid can be supplied to the peripheral part than to the central part of the substrate. As a result, the processing liquid can be retained in the central part and the peripheral part of the substrate for approximately the same amount of time. This enables uniform processing on the substrate with the processing liquid.

CITATION LIST

Patent Literature

Patent Literature 1: Japanese Patent Application Laid-Open Publication No. 2010-067819

SUMMARY OF INVENTION

Technical Problem

However, the surface of the substrate after processing with the processing liquid may not be flat by the substrate processing apparatus disclosed in Patent Literature 1. This is because the surface profile of the substrate before processing with the processing liquid may not be flat in some cases. For example, the surface profile of the substrate may not be flat in a case in which the substrate before processing with the processing liquid is mechanically polished.

The present invention has been made in view of the foregoing and has its object of providing a processing condition specifying method, a substrate processing method, a substrate product production method, a computer program, a storage medium, a processing condition specifying device, and a substrate processing apparatus that can achieve realization of processing with a processing liquid that make the surface of a substrate after processing becomes almost flat.

Solution to Problem

According to an aspect of the present invention, in a processing condition specifying method, a processing condition usable when processing is performed on a target substrate being a substrate to be processed while a discharge position of a processing liquid is moved in a radial direction of the target substrate is specified from among a plurality of processing conditions. The processing condition specifying method incudes: calculating a prediction thickness information piece for each of the processing conditions based on measurement thickness information containing measurement values of thicknesses measured at a plurality of points located on the target substrate in the radial direction of the target substrate, the prediction thickness information piece containing prediction values of thicknesses after the processing at the respective points on the target substrate; evaluating according to a prescribed evaluation method the prediction thickness information pieces each calculated for a corresponding one of the processing conditions and selecting a prediction thickness information piece from among the prediction thickness information pieces; and specifying a processing condition, of the processing conditions, corresponding to the selected prediction thickness information piece. The measurement values contained in the measurement thickness information each indicate a thickness of the target substrate measured in the radial direction of the target substrate before the processing on the target substrate with the processing liquid.

Preferably, the processing condition specifying method according to the present invention further includes calculating an end area processing time based on, of the prediction values contained in the selected prediction thickness information piece, a maximum value of prediction values of thicknesses in an end area of the target substrate in the radial direction. The end area processing time preferably indicates a processing time for which the processing is performed on the end area of the target substrate in a state in which the discharge position of the processing liquid is fixed.

In the calculating an end area processing time in the processing condition specifying method according to the present invention, the end area processing time is preferably calculated based on the maximum value of the prediction values in the end area of the target substrate, a target thickness value of the target substrate, and a processing coefficient. Preferably, the processing coefficient is preset and indicates a processing amount of a substrate with the processing liquid per unit time.

In the calculating a prediction thickness information piece in the processing condition specifying method according to the present invention, the prediction thickness information pieces are preferably calculated based on the measurement thickness information of the target substrate, a target thickness value of the target substrate, and an actually measured processing amount information containing processing amounts at a plurality of points located on a substrate in a radial direction of the substrate, the processing amounts being obtained by actual measurement in the radial direction of the substrate. The actual measurement is done in advance. The processing amounts contained in the actually measured processing amount information preferably each indicate a processing amount in processing the substrate according to a processing condition, of the processing conditions, associated with the actually measured processing amount information.

The calculating a prediction thickness information piece in the processing condition specifying method according to the present disclosure preferably includes: calculating a processing time for each of the points on the target substrate based on the measurement thickness information of the target substrate, the target thickness value of the target substrate, and the actually measured processing amount information, the processing time being a processing time when a thickness at each of the points on the target substrate reaches the target thickness value; selecting a shortest processing time from among the processing times each calculated for a corresponding one of the points on the target substrate; and calculating the prediction thickness information piece based on the measurement thickness information of the target substrate, the actually measured processing amount information, and the shortest processing time.

In the selecting a prediction thickness information piece in the processing condition specifying method according to the present invention, the prediction thickness information pieces are preferably evaluated using prediction values of the thicknesses after the processing at two or more points in an inner area of a surface of the target substrate, the inner area being located inward of an end area of the surface of the target substrate in the radial direction of the target substrate.

Preferably, the prescribed evaluation method in the processing condition specifying method according to the present invention is a method for evaluation as to how close a prediction thickness pattern indicated by the prediction thickness information piece is to flat. The prediction thickness pattern preferably indicates a distribution of the prediction values of the thicknesses of the target substrate in the radial direction of the target substrate. Preferably, the prescribed evaluation method includes at least one evaluation method of a first evaluation method, a second evaluation method, and a third evaluation method. Preferably, the first evaluation method is a method for evaluation as to how close the prediction thickness pattern is to flat using an index indicating a degree of unevenness of the prediction thickness pattern. Preferably, the second evaluation method is a method for evaluation as to how close the prediction thickness pattern is to flat using an index that is based on the number of prediction values, of the prediction values constituting the prediction thickness pattern, close to a target thickness value of the target substrate. Preferably, the third evaluation method is a method for evaluation as to how close the prediction thickness pattern is to flat using an index indicating how close an inclination of the prediction thickness pattern to zero.

In the processing condition specifying method according to the present invention, the first evaluation method preferably includes at least one method of a first method, a second method, a third method, and a fourth method. The first method of the first evaluation method is preferably a method for evaluation as to how close the prediction thickness pattern is to flat using as the index differences that are values obtained by subtracting the prediction values constituting the prediction thickness pattern from respective values on a first evaluation straight line. Preferably, the first evaluation straight line is a straight line tangent to the prediction thickness pattern from a side larger than the prediction thickness pattern. Preferably, the second method of the first evaluation method is a method for evaluation as to how close the prediction thickness pattern is to flat using as the index differences that are values obtained by subtracting respective values on a second evaluation straight line from the prediction values constituting the prediction thickness pattern. Preferably, the second evaluation straight line is a straight line tangent to the prediction thickness pattern from a side smaller than the prediction thickness pattern. Preferably, the third method of the first evaluation method is a method for evaluation as to how close the prediction thickness pattern is to flat using as the index differences that are values obtained by subtracting respective values on a third evaluation straight line from the prediction values constituting the prediction thickness pattern. Preferably, the third evaluation straight line is an approximate straight line of the prediction thickness pattern obtained by a least-squares method. Preferably, the fourth method of the first evaluation method is a method for evaluation as to how close the prediction thickness pattern is to flat using as the index differences that are values obtained by subtracting respective values on a fourth evaluation straight line from the prediction values constituting the prediction thickness pattern. Preferably, the fourth evaluation straight line is a straight line indicating a target thickness value of the target substrate.

In the processing condition specifying method according to the present invention, the second evaluation method preferably includes at least one method of a first method and a second method. Preferably, the first method of the second evaluation method is a method for evaluation as to how close the prediction thickness pattern is to flat using as the index the number of prediction values, of the prediction values constituting the prediction thickness pattern, present in a tolerable range including a fifth evaluation straight line. Preferably, the fifth evaluation straight line is a straight line indicating the target thickness value of the target substrate. Preferably, the second method of the second evaluation method is a method for evaluation as to how close the prediction thickness pattern is to flat using as the index differences that are obtained by subtracting respective values on a sixth evaluation straight line from the prediction values constituting the prediction thickness pattern. Preferably, the sixth evaluation straight line is a straight line indicating the target thickness value of the target substrate.

In the processing condition specifying method according to the present invention, the third evaluation method preferably includes at least one method of a first method and a second method. Preferably, the first method of the third evaluation method is a method for evaluation as to how close the prediction thickness pattern is to flat using as the index an inclination of a seventh evaluation straight line relative to an eighth evaluation straight line. Preferably, the seventh evaluation straight line is an approximate straight line of the prediction thickness pattern obtained by a least-squares method. Preferably, the eighth evaluation straight line is a straight line indicating a constant valued. Preferably, the second method of the third evaluation method is a method for evaluation as to how close the prediction thickness pattern is to flat using as the index an inclination of the prediction thickness pattern at each of the points located on the target substrate in the radial direction of the target substrate.

According to another aspect of the present invention, a substrate processing method includes performing, based on the processing condition specified by the above-described processing condition specifying method, the processing on the target substrate with the processing liquid while moving the discharge position of the processing liquid in the radial direction of the target substrate.

According to a still another aspect of the present invention, in a substrate product production method for producing a substrate product, the substrate product is produced by performing the processing on the target substrate according to the above-described substrate processing method, the substrate product being the target substrate after the processing.

According to yet another aspect of the present invention, a computer program causes a computer to execute the above-described processing condition specifying method.

According to still another aspect of the present invention, a storage medium stores the above-described computer program therein.

According to yet another aspect of the present invention, a processing condition specifying device specifies a processing condition from among a plurality of processing conditions, the processing condition being usable when processing is performed on a target substrate while a discharge position of a processing liquid is moved in a radial direction of the target substrate, the target substrate being a substrate to be processed. The processing condition specifying device includes a thickness predicting section, an evaluating section, and a specifying section. The thickness predicting section calculates a prediction thickness information piece for each of the processing conditions based on measurement thickness information containing measurement values of thicknesses measured at a plurality of points located on the target substrate in the radial direction of the target substrate, the prediction thickness information piece containing prediction values of thicknesses after the processing at the respective points on the target substrate. The evaluating section evaluates according to a prescribed evaluation method the prediction thickness information pieces each calculated for a corresponding one of the processing conditions and selects a prediction thickness information piece from among the prediction thickness information pieces. The specifying section specifies a processing condition, of the processing conditions, corresponding to the selected prediction thickness information piece. The measurement values contained in the measurement thickness information each indicate a thickness of the target substrate measured in the radial direction of the target substrate before the processing on the target substrate with the processing liquid.

According to a still another aspect of the present invention, a substrate processing apparatus includes the above-described processing condition specifying device and a processing apparatus. The processing device processes the target substrate with the processing liquid while moving the discharge position of the processing liquid in the radial direction of the target substrate based on the processing condition specified by the processing condition specifying device.

Advantageous Effects of Invention

According to the present invention, processing with a processing liquid by which the surface of a substrate after the processing is made almost flat can be realized.

BRIEF DESCRIPTION OF DRAWINGS

FIG. 8 is a diagram of actual measurement processing amount table stored in storage in the embodiment.

FIG. 9A is a graph representation showing processing times of the substrate calculated by the control section in the embodiment. FIG. 9B is a graph representation showing prediction values of thicknesses of the substrate calculated by the controller in the embodiment. FIG. 9C is a graph representation showing differences between a target thickness value and the prediction values in the embodiment.

FIG. 10A is a diagram explaining a first method of a first evaluation method in the embodiment. FIG. 10B is a diagram explaining a second method of the first evaluation method. FIG. 10C is a diagram explaining a third method of the first evaluation method. FIG. 10D is a diagram explaining a fourth method of the first evaluation method.

FIG. 15 is a flowchart depicting Step S3 in FIG. 14.

FIG. 16 is a flowchart depicting Step S31 in FIG. 15.

DESCRIPTION OF EMBODIMENTS

Figure 1:
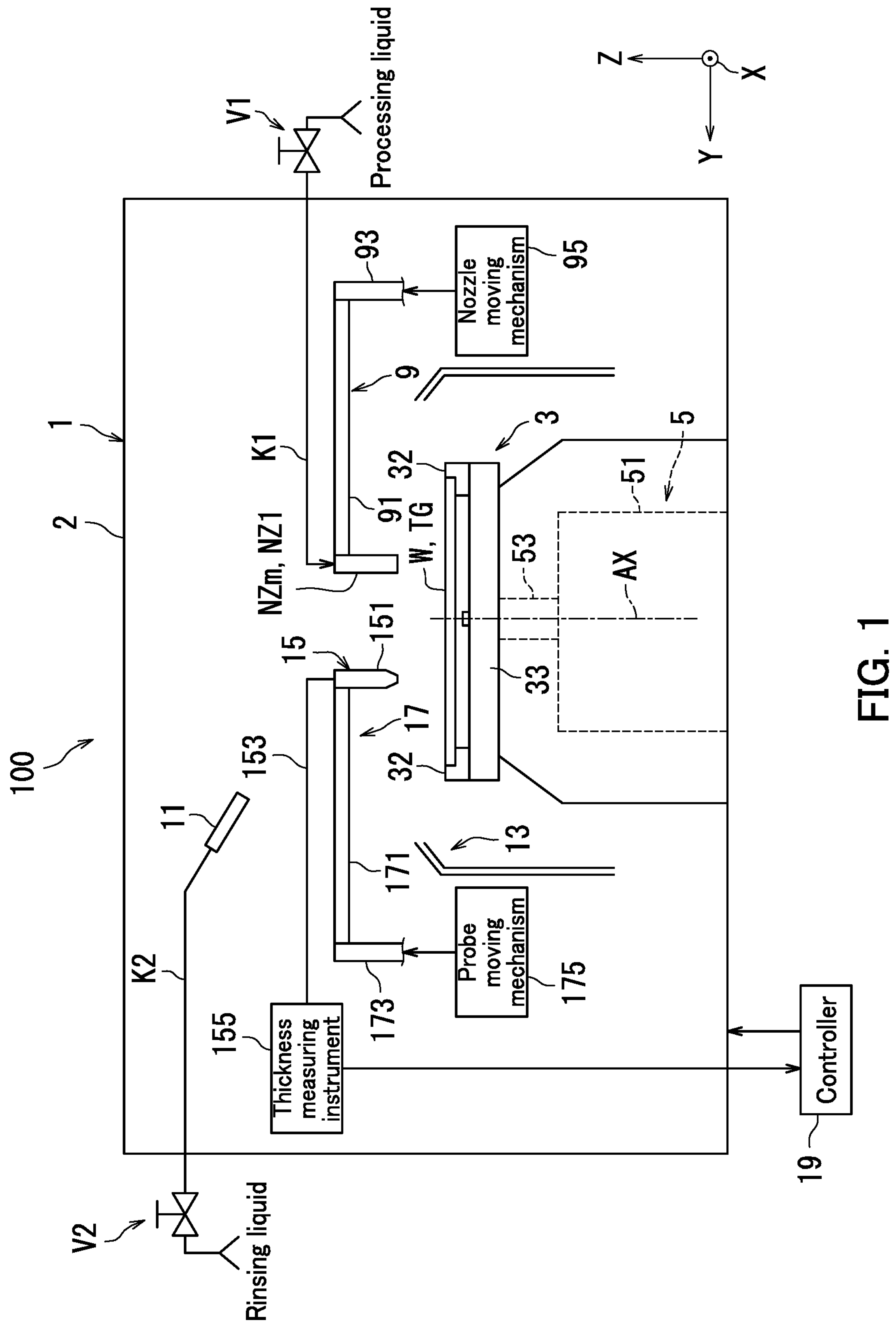
FIG. 1 is a diagram illustrating a substrate processing apparatus according to an embodiment of the present invention.

The following describes an embodiment of the present invention with reference to the accompanying drawings. Note that elements that are the same or equivalent are indicated by the same reference signs in the drawings and description thereof is not repeated. For the sake of easy understanding, an X-axis, a Y-axis, and a Z-axis are indicated in the drawings as appropriate. The X-axis, the Y-axis, and the Z-axis are perpendicular to one another. The X-axis and the Y-axis are parallel to a horizontal plane, and the Z-axis is parallel to a vertical direction. Note that the words "as viewed in plan" means when viewing an object from vertically above.

With reference to FIGS. 1 to 17, a substrate processing apparatus 100 according to an embodiment of the present invention will be described. First of all, the substrate processing apparatus 100 will be described with reference to FIG. 1. FIG. 1 is a diagram illustrating the substrate processing apparatus 100. The substrate processing apparatus 100 illustrated in FIG. 1 processes a substrate W with a processing liquid. That is, the substrate W is a substrate that is a processing target to be processed with the processing liquid. The substrate W corresponds to an example of a "target substrate". The substrate processing apparatus 100 is a single-wafer substrate processing apparatus that processes substrates W one at a time. The substrate W is substantially disc-shaped.

The substrate W is a bare substrate in the present embodiment. The bare substrate refers to a substrate with no films formed thereon. That is, the bare substrate is a substrate before subjected to film formation. For example, the bare substrate is a substrate having been subjected to mechanical polishing and not subjected to film formation.

Examples of the substrate W include a semiconductor wafer, a substrate for liquid crystal display device use, a substrate for plasma display use, a substrate for field emission display (FED) use, a substrate for optical disk use, a substrate for magnetic disk use, a substrate for magneto-optical disk use, a substrate for photomask use, a ceramic substrate, and a substrate for solar cell use. In the description of the following embodiment, the substrate W is a semiconductor wafer made of silicon.

As illustrated in FIG. 1, the substrate processing apparatus 100 includes a processing apparatus 1, a controller 19, a valve V1, a supply pipe K1, a valve V2, and a supply pipe K2. The controller 19 controls the processing apparatus 1, the valve V1, and the valve V2.

The processing apparatus 1 processes the substrate W by discharging the processing liquid toward the substrate W. Specifically, the processing apparatus 1 processes the substrate W with the processing liquid while moving a discharge position of the processing liquid in the radial direction of the substrate W. The processing liquid is a chemical liquid. In a case for example in which the processing liquid is an etching solution, the processing apparatus 1 performs etching on the substrate W.

Examples of the etching solution includes nitrogen fluoride (a mixed liquid of hydrofluoric acid (HF) and nitric acid ($HNO_3$)), hydrofluoric acid, buffered hydrofluoric acid (BHF), ammonium fluoride, hydrofluoric acid ethylene glycol (HFEG, a mixed liquid of hydrofluoric acid and ethylene glycol), and phosphoric acid ($H_3PO_4$). Note that no particular limitations are placed on the type of the etching solution as long as it is capable of etching the substrate W and the etching solution may be acidic or alkaline, for example.

Specifically, the processing apparatus 1 includes a chamber 2, a spin chuck 3, a spin motor 5, a nozzle Nzm, a nozzle moving section 9, a nozzle 11, a plurality of guards 13 (two guards 13 in the present embodiment), a thickness measuring section 15, and a probe moving section 17. "m" in the "nozzle Nzm" represents an integer of at least 1. In the example illustrated in FIG. 1, m is 1. That is, the processing apparatus 1 in the example illustrated in FIG. 1 includes a nozzle NZ1 that discharges the processing liquid. However, the processing apparatus 1 may include a plurality of nozzles NZm that each discharge the processing liquid.

The chamber 2 is substantially box shaped. The chamber 2 accommodates the substrate W, the spin chuck 3, the spin motor 5, the nozzle NZ1, the nozzle moving section 9, the nozzle 11, the guards 13, the thickness measuring section 15, the probe moving section 17, a part of the supply pipe K1, and a part of the supply pipe K2.

The spin chuck 3 holds and rotates the substrate W. Specifically, the spin chuck 3 rotates the substrate W about a rotation axis AX while horizontally holding the substrate W in the chamber 2. Specifically, the spin chuck 3 is driven by the spin motor 5 to rotate.

The spin chuck 3 includes a plurality of chuck members 32 and a spin base 33. The chuck members 32 are provided on the spin base 33 along the periphery of the substrate W. The chuck members 32 hold the substrate W in a horizontal posture. The spin base 33 is substantially disk shaped and supports the chuck members 32 in a horizontal posture. The spin motor 5 rotates the spin base 33 about the rotation axis AX. Accordingly, the spin base 33 rotates about the rotation axis AX. As a result, the substrate W held by the chuck members 32 provided on the spin base 33 is rotated about the rotation axis AX. Specifically, the spin motor 5 includes a motor main body 51 and a shaft 53. The shaft 53 is connected to the spin base 33. The motor main body 51 rotates the shaft 53 to rotate the spin base 33.

The nozzle NZ1 discharges the processing liquid toward the substrate W during rotation of the substrate W. The processing liquid is a chemical liquid. For example, the processing liquid is an etching solution.

The supply pipe K1 supplies the processing liquid to the nozzle NZ1. The valve V1 switches the nozzle NZ1 between processing liquid supply start and processing liquid supply stop.

The nozzle moving section 9 moves the nozzle NZ1 in a substantially vertical direction and a substantially horizontal direction. Specifically, the nozzle moving section 9 includes an arm 91, a rotational shaft 93, and a nozzle moving mechanism 95. The arm 91 extends in a substantially horizontal direction. The nozzle NZ1 is provided at the tip end of the arm 91. The arm 91 is connected to the rotational shaft 93. The rotational shaft 93 extends in a substantially vertical direction. The nozzle moving mechanism 95 turns the rotational shaft 93 about a rotation axis extending in a substantially vertical direction to turn the arm 91 along a substantially horizontal plane. As a result, the nozzle NZ1 moves along the substantially horizontal plane. Furthermore, the nozzle moving mechanism 95 raises and lowers the rotational shaft 93 in a substantially vertical direction to raise and lower the arm 91. As a result, the nozzle NZ1 moves in a substantially vertical direction. The nozzle moving mechanism 95 includes a ball screw mechanism and an electric motor that provides drive power to the ball screw mechanism, for example.

The nozzle 11 discharges a rinsing liquid toward the substrate W during rotation of the substrate W. Examples of the rinsing liquid include deionized water, carbonated water, electrolytic ionized water, hydrogen water, ozone water, and a hydrochloric acid water with diluted concentration (e.g., approximately 10 ppm to 100 ppm).

The supply pipe K2 supplies the rinsing liquid to the nozzle 11. The valve V2 switches the nozzle 11 between rinsing liquid supply start and rinsing liquid supply stop.

The guards 13 each are substantially cylindrical in shape. The guards 13 receive the processing liquid or the rinsing liquid discharged from the substrate W.

The thickness measuring section 15 measures the thickness of the substrate W and outputs to the controller 19 measurement thickness information (also referred to below as "measurement thickness information MG") indicating the thickness of the substrate W. In the present embodiment, the thickness measuring section 15 measures the thickness of the substrate W in a non-contact manner and outputs the measurement thickness information MG indicating the thickness of the substrate W to the controller 19. The thickness measuring section 15 measures the thickness of the substrate W by spectrographic interferometry, for example. Specifically, the thickness measuring section 15 includes an optical probe 151, a connecting wire 153, and a thickness measuring instrument 155. The optical probe 151 includes a lens. The connecting wire 153 connects the optical probe 151 to the thickness measuring instrument 155. The connecting wire 153 includes an optical fiber. The thickness measuring instrument 155 includes a light source and a photo detector. Light emitted from the light source of the thickness measuring instrument 155 is emitted to the substrate W via the connecting wire 153 and the optical probe 151. The light reflected by the substrate W is received by the photo detector of the thickness measuring instrument 155 via the optical probe 151 and the connecting wire 153. The thickness measuring instrument 155 analyzes the received light and calculates a thickness of the substrate W based on a result of analysis. The thickness measuring instrument 155 outputs to the controller 19 the measurement thickness information MG indicating the thickness of the substrate W.

The probe moving section 17 moves the optical probe 151 in a substantially vertical direction and a substantially horizontal direction. Specifically, the probe moving section 17 includes an arm 171, a rotational shaft 173, and a probe moving mechanism 175. The arm 171 extends in a substantially horizontal direction. The optical probe 151 is provided at the tip end of the arm 171. The arm 171 is connected to the rotational shaft 173. The rotational shaft 173 extends in a substantially vertical direction. The probe moving mechanism 175 turns the rotational shaft 173 about a rotation axis extending in a substantially vertical direction to turn the arm 171 along a substantially horizontal plane. As a result, the optical probe 151 moves along the substantially horizontal plane. Furthermore, the probe moving mechanism 175 raises and lowers the rotational shaft 173 in a substantially vertical direction to raise and lower the arm 171. As a result, the optical probe 151 moves in a substantially vertical direction. The probe moving mechanism 175 includes a ball screw mechanism and an electric motor that provides drive power to the ball screw mechanism, for example.

Figure 2:
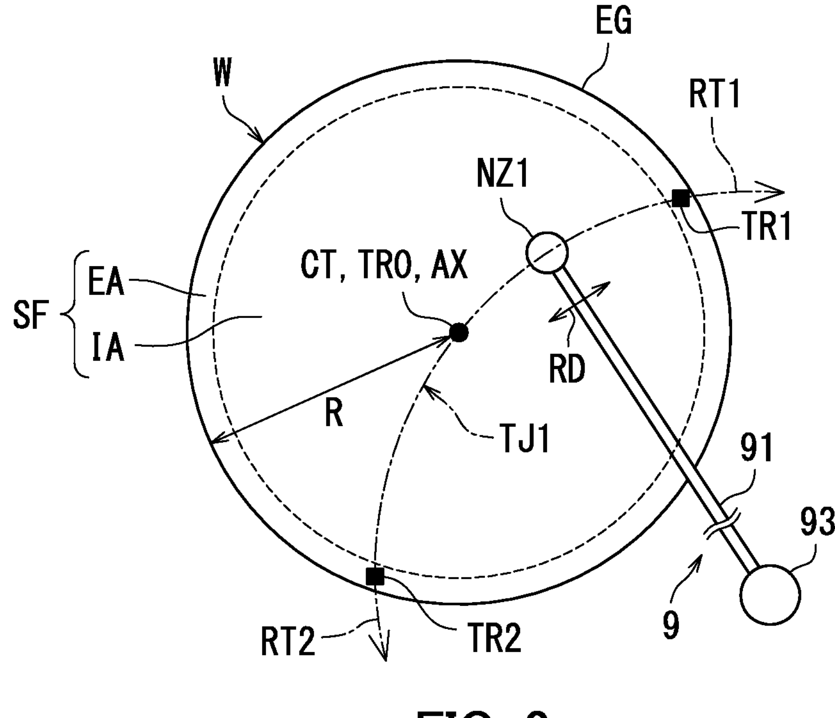
FIG. 2 is a plan view explaining scanning processing on a substrate using a nozzle of the substrate processing apparatus according to the embodiment.

Scanning processing on the substrate W by the nozzle NZ1 will be described next with reference to FIG. 2. FIG. 2 is a plan view explaining the scanning processing on the substrate W by the nozzle NZ1. As illustrated in FIG. 2, the scanning processing on the substrate W by the nozzle NZ1 is processing on the substrate W with the processing liquid that is performed while the discharge position of the processing liquid is moved in a radial direction RD of the substrate W. Specifically, the scanning processing by the nozzle NZ1 is processing of discharging the processing liquid toward the substrate W while moving the nozzle NZ1 so that a liquid landing point on a surface SF of the substrate W where the processing liquid lands draws an arc-shaped trajectory TJ1 as viewed in plan. During the scanning processing, the nozzle NZ1 is spaced from the substrate W in a direction of the rotation axis AX. Note that the substrate W has a radius R shorter than the length of the arm 91 and therefore the trajectory TJ1 can in effect be regarded as a substantially straight line.

The trajectory TJ1 passes through an edge EG of the substrate W and a center CT of the substrate W. The center CT is a part of the substrate W through which the rotation axis AX passes. The edge EG is the peripheral part of the substrate W. The scanning processing on the substrate W by the nozzle NZ1 is performed during rotation of the substrate W.

Specifically, while discharging the processing liquid toward the substrate W, the nozzle NZ1 turns in a turning direction RT1 that is clockwise and turns in a turning direction RT2 that is anticlockwise between a turnaround point TR1 and a directly-above point TR0 directly above the center CT of the substrate. In the present embodiment, the turnaround point TR1 is located directly above an end area EA of the substrate W in the radial direction RD. Also, the turnaround point TR1 is a turnaround point of the nozzle NZ1 moving in the turning direction RT1. The directly-above point TR0 directly above the center CT of the substrate W is a turnaround point of the nozzle NZ1 moving in the turning direction RT2.

Note that the surface SF of the substrate W has the end area EA and an inner area IA located inward of the end area EA in the radial direction RD of the substrate W. The inner area IA is a substantially circular area. The end area EA is a substantially annular area surrounding the inner area IA. The end area EA has a width in the radial direction RD of at least 1/15 and no greater than 1/5 of the radius R of the substrate W, for example.

Further specifically, the nozzle NZ1 turns in the turning direction RT1 from the directly-above point TR0 directly above the center CT of the substrate W, turns back at the turnaround point TR1, and turns in the turning direction RT2. Furthermore, the nozzle NZ1 turns at the directly-above point TR0 directly above the center CT of the substrate W and turns in the turning direction RT1. The nozzle NZ1 discharges the processing liquid toward the surface SF of the substrate W while repeating movement between the turnaround point TR1 and the directly-above point TR0 directly above the center CT of the substrate W.

The moving speed of the nozzle NZ1 increases as the nozzle NZ1 approaches the turnaround point TR1, for example. The moving speed of the nozzle NZ1 is a moving speed thereof in terms of the radial direction RD of the substrate W. Note that the change in moving speed of the nozzle NZ1 is not limited to linear change and may be nonlinear change. Alternatively, the moving speed of the nozzle NZ1 may change in steps. Note that the moving speed of the nozzle NZ1 may be constant.

Note that the nozzle NZ1 may repeat movement between the turnaround point TR1 and a turnaround point TR2. Specifically, the nozzle NZ1 turns in the turning direction RT1, turns back at the turnaround point TR1, and turns in the turning direction RT2. The nozzle NZ1 then turns back at the turnaround point TR2 and turns in the turning direction RT1. The center CT of the substrate W is located between the turnaround point TR1 and the turnaround point TR2 on the trajectory TJ1 as viewed in plan. The turnaround point TR2 is a turnaround point of the nozzle NZ1 moving in the turning direction RT2. Also, the turnaround point TR2 is located at a location different from the turnaround point TR1 and directly above the end area EA of the substrate W in the radial direction RD.

Figure 3:
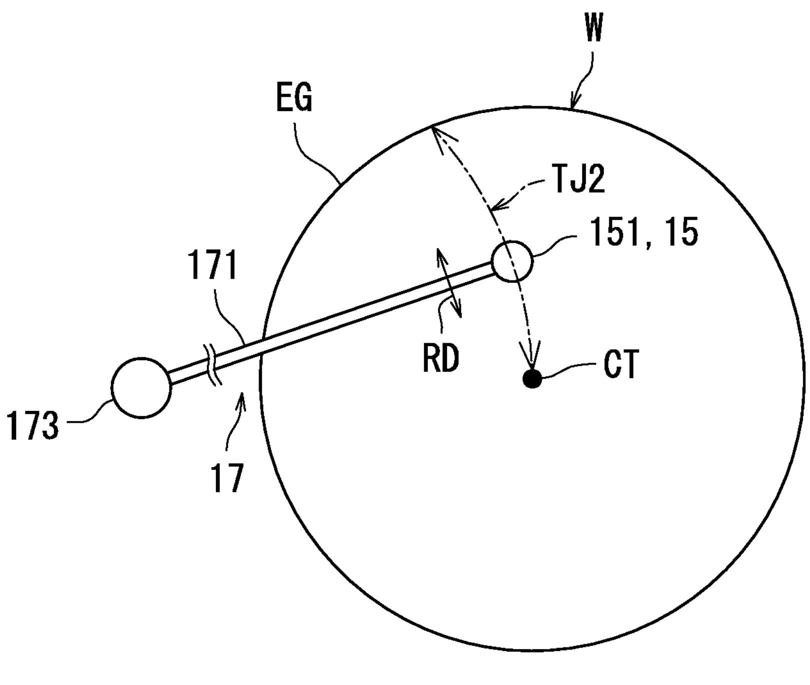
FIG. 3 is a plan view explaining scanning processing on the substrate using an optical probe of the substrate processing apparatus according to the embodiment.

With reference to FIG. 3, scanning processing on the substrate W by the optical probe 151 will be described next. FIG. 3 is a plan view explaining the scanning processing on the substrate W by the optical probe 151. As illustrated in FIG. 3, the scanning processing by the optical probe 151 is processing of measuring the thickness of the substrate W while moving the optical probe 151 so that measurement points where the thickness of the substrate W is measured form a trajectory TJ2 as viewed in plan. The trajectory TJ2 passes through the edge EG of the substrate W and the center CT of the substrate W. The scanning processing on the substrate W by the optical probe 151 is performed during rotation of the substrate W.

Specifically, the optical probe 151 moves along measurement points while moving between the center CT and the edge EG of the substrate W as viewed in plan. In other words, the thickness measuring section 15 measures the thickness of the substrate W at each of the measurement points on the substrate W. As a result, a thickness distribution of the substrate W from the center CT to the edge EG of the substrate W is measured. That is, a thickness distribution of the substrate W in the radial direction RD is measured.

Figure 4:
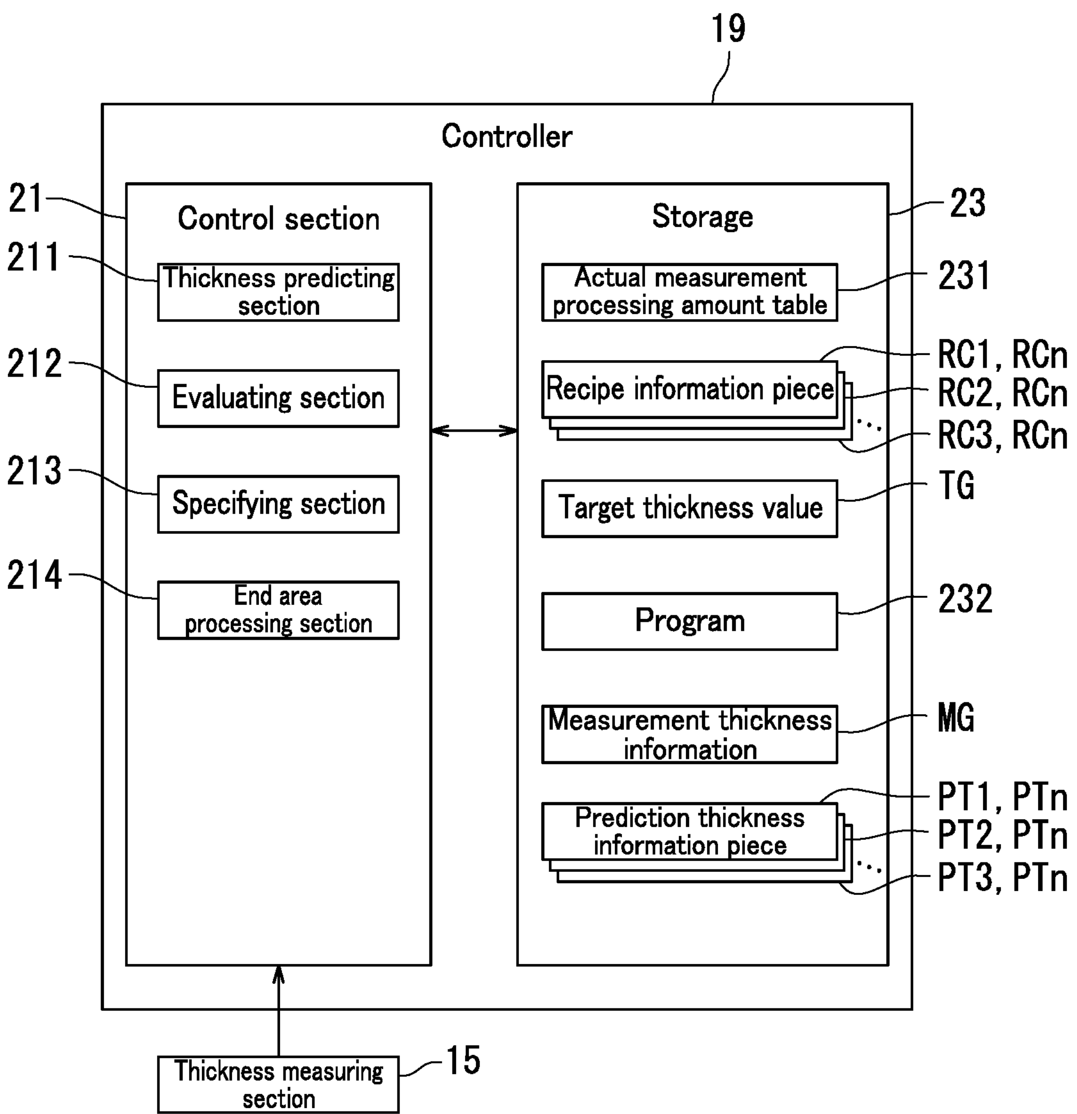
FIG. 4 is a block diagram of a controller in the embodiment.

With reference to FIGS. 4 to 7, the controller 19 illustrated in FIG. 1 will be described next in detail. FIG. 4 is a block diagram of the controller 19. The controller 19 illustrated in FIG. 4 specifies, from among mutually different recipe information pieces RCn, a recipe information piece RCn usable when processing is performed on the substrate W, which is the processing target, while the discharge position of the processing liquid is moved in the radial direction RD of the substrate W. "n" in "RCn" represents an integer of at least 1. The controller 19 corresponds to an example of a "processing condition specifying device".

The recipe information pieces RCn each are an information piece that defines processing contents and a processing procedure for the substrate W. That is, each recipe information piece RCn is an information piece that defines a processing condition for the substrate W. In one example, the processing condition for the substrate W includes at least a processing execution time of processing on the substrate W with the processing liquid, information indicating the nozzle NZ1 that discharges the processing liquid toward the substrate W, and information indicating the moving speed of the nozzle NZ1 that discharges the processing liquid toward the substrate W. The moving speed of the nozzle NZ1 is a moving speed thereof at each point on the substrate W in the radial direction RD or a moving speed thereof in each segment on the substrate W in the radial direction RD, for example. Each recipe information piece RCn corresponds to an example of a "processing condition" for processing the substrate W with the processing liquid.

Specifically, the controller 19 includes a control section 21 and storage 23 as illustrated in FIG. 4. The control section 21 controls the storage 23. The control section 21 also controls each element of the substrate processing apparatus 100.

The control section 21 includes a processor such as a central processing unit (CPU). The storage 23 includes a storage device and stores data and computer programs therein. The processor of the control section 21 executes the computer program stored in the storage device of the storage 23 to control each element of the substrate processing apparatus 100.

For example, the storage 23 includes a main storage device such as semiconductor memory and an auxiliary storage device such as semiconductor memory and a hard disk drive. The storage 23 may include a removable medium such as an optical disk. The storage 23 is a non-transitory computer-readable storage medium, for example. The storage 23 corresponds to an example of a "storage medium".

Specifically, the storage 23 pre-stores therein an actual measurement processing amount table 231, the recipe information pieces RCn, a target thickness value TG of the substrate W, and a computer program 232. The target thickness value TG of the substrate W is a target thickness value of the substrate W after processing with the processing liquid. The target thickness value TG may be changed by user input through an input device. The actual measurement processing amount table 231 will be described later.

The storage 23 further stores therein the measurement thickness information MG of the substrate W output by the thickness measuring section 15. The measurement thickness information MG contains a measurement value of thickness at each of a plurality of points (a plurality of measurement points) located on the substrate W in the radial direction RD. That is, the measurement thickness information MG contains a plurality of measurement values of thicknesses measured at respective points (measurement points) located on the substrate W in the radial direction RD. In the present embodiment, the points (measurement points) located on the substrate W in the radial direction RD are located at regular intervals in the radial direction RD of the substrate W.

Figure 5:
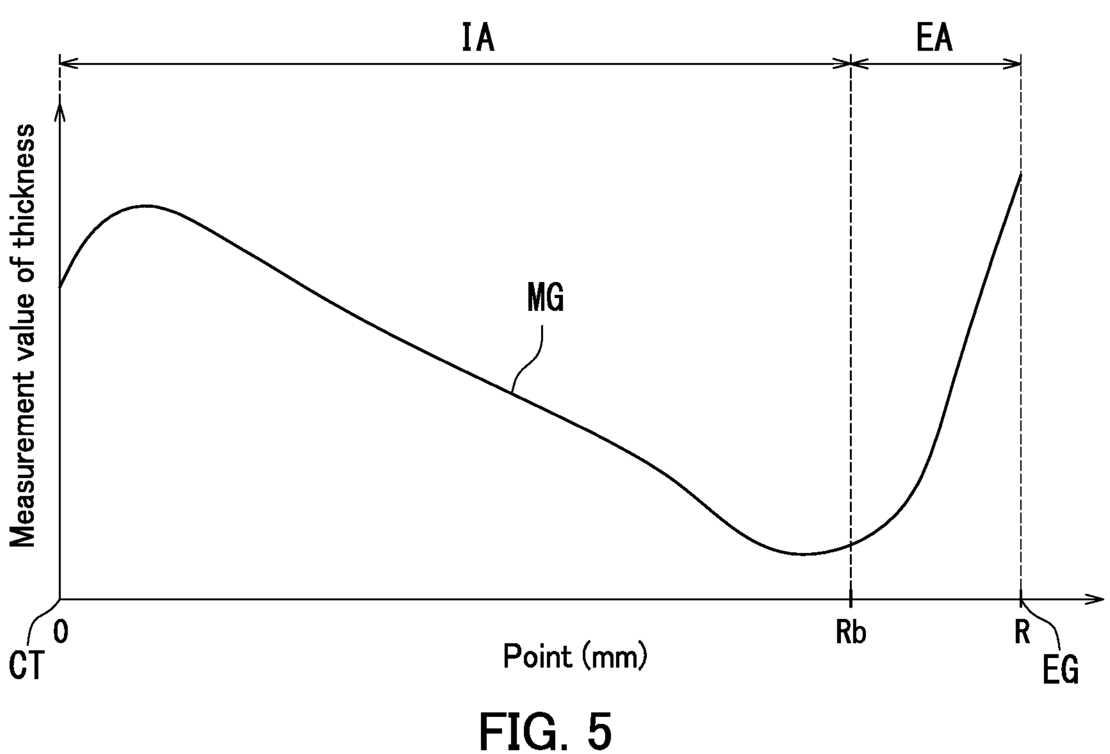
FIG. 5 is a graph representation showing measurement values of thicknesses of the substrate measured by a thickness measuring section in the embodiment.

FIG. 5 is a graph representation showing the measurement values of thicknesses of the substrate W measured by the thickness measuring section 15. The horizontal axis indicates points (mm) on the substrate W from the center CT of the substrate W in the radial direction RD of the substrate W. On the horizontal axis, the point at "0" mm is the center CT of the substrate W and the point at "R" mm is the outermost point (vicinity of the edge EG) of the substrate W in the radial direction RD. "R" corresponds to a radius R of the substrate W. The vertical axis indicates measurement values of thicknesses of the substrate W. For example, the vertical axis is on the order of several μm to several tens of μm.

In the substrate W exemplified in FIG. 5, the thickness gradually decreases from the vicinity of the center CT of the substrate W toward the outside thereof in the radial direction RD and abruptly increases in the end area EA (Rb [mm] to R [mm]) of the substrate W. The thickness of the substrate W is the largest at the outermost point (vicinity of the edge EG) of the substrate W in the radial direction RD.

Referring again to FIG. 4, the control section 21 includes a thickness predicting section 211, an evaluating section 212, and a specifying section 213. Specifically, the processor of the control section 21 executes the computer program 232 stored in the storage device of the storage 23 to function as the thickness predicting section 211, the evaluating section 212, and the specifying section 213. Preferably, the control section 21 further includes an end area processing section 214. In this case, the processor of the control section 21 executes the computer program 232 stored in the storage device of the storage 23 to function as the end area processing section 214. The end area processing section 214 will be described later.

The thickness predicting section 211 acquires the measurement thickness information MG from the storage 23. The thickness predicting section 211 calculates a prediction thickness information piece PTn for each of the recipe information pieces RCn based on the measurement thickness information MG. That is, the thickness predicting section 211 calculates prediction thickness information pieces PTn corresponding to the respective recipe information pieces RCn based on the measurement thickness information MG. "n" in "PTn" represents an integer of at least 1. The prediction thickness information pieces PTn each contain prediction values of thicknesses after processing at a plurality of points located on the substrate W in the radial direction RD. That is, each prediction thickness information piece PTn contains a plurality of prediction values of thicknesses after processing that are predicted at the respective points located on the substrate W in the radial direction RD. In the present embodiment, the points located on the substrate W in the radial direction RD are spaced at regular intervals in the radial direction RD of the substrate W. The storage 23 stores the prediction thickness information pieces PTn in association with the respective recipe information pieces RCn. A calculation method of the prediction thickness information pieces PTn will be described later in detail.

Here, a prediction thickness pattern (also referred to below as "prediction thickness pattern PNn") indicated by a prediction thickness information piece PTn will be defined. "n" in "PNn" represents an integer of at least 1. The prediction thickness pattern PNn indicates a distribution of prediction values of thicknesses in the radial direction RD of the substrate W after processing. The prediction values of thicknesses after processing that constitute the prediction thickness pattern PNn are prediction values of thicknesses after processing contained in a prediction thickness information piece PTn.

The following describes as an example a case in which prediction thickness information pieces PT1 to PT3 are calculated for respective recipe information pieces RC1 to RC3. Note that the number of the recipe information pieces RCn is not limited to 3 and may be 2 or 4 or more. Similarly, the number of the prediction thickness information pieces PTn is not limited to 3 and may be 2 or 4 or more.

Figure 6:
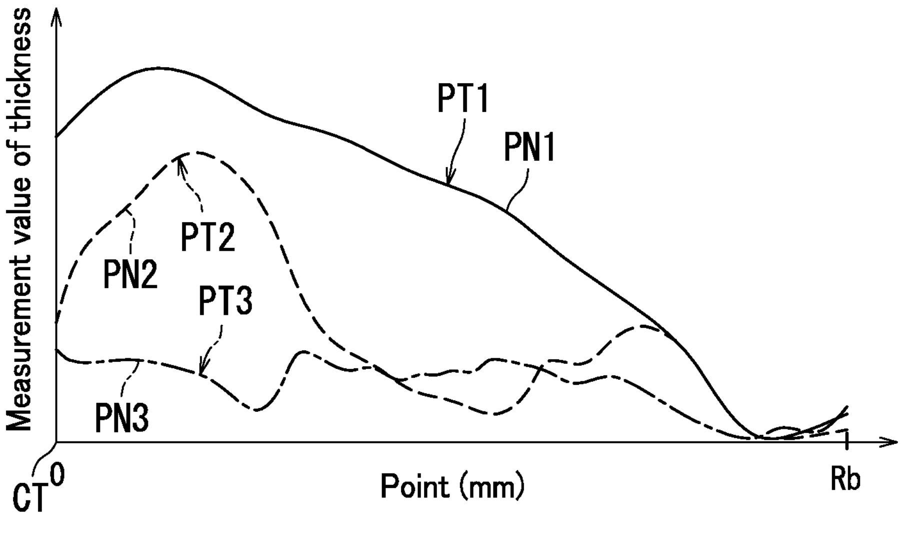
FIG. 6 is a graph representation showing prediction values of thicknesses of the substrate calculated by a control section in the embodiment.

FIG. 6 is a graph representation showing the prediction thickness information pieces PT1 to PT3. The horizontal axis indicates points (mm) located on the substrate W in the radial direction RD of the substrate W from the center CT of the substrate W. The vertical axis indicates the prediction thickness of the substrate W after processing. For example, the vertical axis is on the order of several μm to several tens of μm. In FIG. 6, prediction values of thicknesses in the prediction thickness information piece PT1 indicate a prediction thickness pattern PN1. Prediction values of thicknesses in the prediction thickness information piece PT2 indicate a prediction thickness pattern PN2. Prediction values of thicknesses in the prediction thickness information piece PT3 indicate a prediction thickness pattern PN3. Note that FIG. 6 shows prediction values of thicknesses after processing at a plurality of points in the inner area IA (0 [mm] to Rb [mm]) of the substrate W.

As illustrated in FIGS. 4 and 6, the prediction thickness information piece PT1 is calculated for the recipe information piece RC1. The prediction thickness information piece PT2 is calculated for the recipe information piece RC2. The prediction thickness information piece PT3 is calculated for the recipe information piece RC3. The three prediction thickness information pieces PT1 to PT3 differ from one another.

The evaluating section 212 evaluates the prediction thickness information pieces PT1 to PT3, each of which is calculated for a corresponding one of the recipe information pieces RC1 to RC3, according to a prescribed evaluation method, and selects at least one prediction thickness information piece PTn from the prediction thickness information pieces PT1 to PT3. In the present embodiment, the evaluating section 212 evaluates the prediction thickness information pieces PT1 to PT3 according to the prescribed evaluation method and selects one prediction thickness information piece PT3 of the prediction thickness information pieces PT1 to PT3. Specifically, the evaluating section 212 evaluates the prediction thickness information pieces PT1 to PT3 according to the prescribed evaluation method and selects from among the prediction thickness information pieces PT1 to PT3 the prediction thickness information piece PT3 indicating the prediction thickness pattern PN3 that is the closest to flat. The prescribed evaluation method will be described later in detail.

Figure 7:
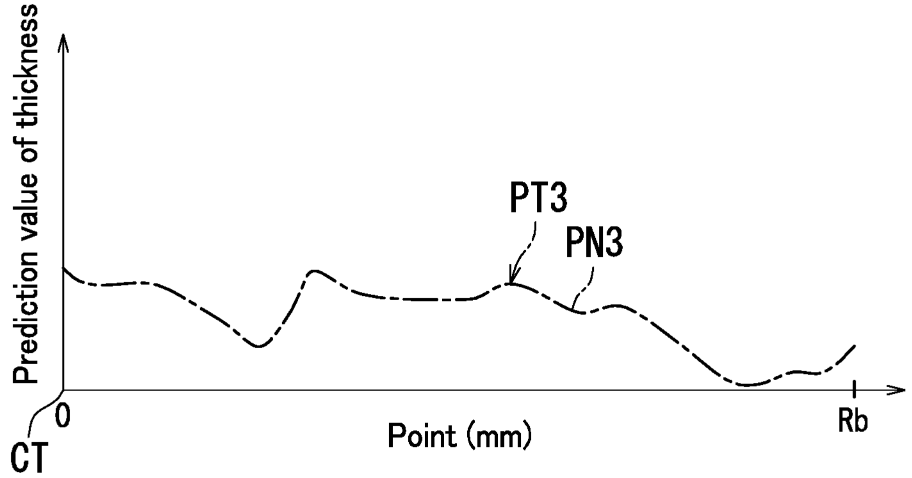
FIG. 7 is a graph representation showing prediction values of thicknesses of the substrate selected by the control section in the embodiment.

FIG. 7 is a graph representation showing the prediction thickness information piece PT3 selected by the evaluating section 212. The horizontal axis and the vertical axis in FIG. 7 are the same as the horizontal axis and the vertical axis in FIG. 6, respectively.

As illustrated in FIGS. 4 and 7, the specifying section 213 specifies the recipe information piece RC3 corresponding to the prediction thickness information piece PT3 selected by the evaluating section 212. The control section 21 controls the processing apparatus 1 based on the recipe information piece RC3 specified by the specifying section 213. In response, the processing apparatus 1 processes the substrate W with the processing liquid while moving the discharge position of the processing liquid in the radial direction RD of the substrate W based on the specified recipe information piece RC3. In this case, the control section 21 controls the processing apparatus 1 so as to process the substrate W in accordance with the recipe information piece RC3 specified by the specifying section 213, for example. In response, the processing apparatus 1 processes the substrate W with the processing liquid in accordance with the specified recipe information piece RC3. Alternatively, for example, the control section 21 may modify the recipe information piece RC3 specified by the specifying section 213 and control the processing apparatus 1 so as to process the substrate W in accordance with the modified recipe information piece RC3. In response, the processing apparatus 1 processes the substrate W with the processing liquid in accordance with the modified recipe information piece RC3.

As has been described so far with reference to FIGS. 4 to 7, the recipe information piece RC3 corresponding to the prediction thickness information piece PT3 selected based on evaluation by the evaluating section 212 is specified in the present embodiment.

Therefore, processing on the substrate W based on the recipe information piece RC3 specified by the specifying section 213 can result in processing on the substrate W that makes the substrate W have a thickness according to the prediction values contained in the prediction thickness information piece PT3 properly evaluated by the evaluating section 212. As a result, processing with the processing liquid by which the surface SF of the substrate W after processing is made almost flat can be realized.

In other words, processing on the substrate W based on the recipe information piece RC3 specified by the specifying section 213 can result in processing on the substrate W that makes the substrate W have a thickness according to the prediction thickness pattern PN3 that is the closest to flat. As a result, processing with the processing liquid by which the surface SF of the substrate W after processing is made almost flat can be realized.

In particular, in the present embodiment, the evaluating section 212 preferably evaluates the prediction thickness information pieces PT1 to PT3 using the prediction values of the thicknesses after processing at two or more points in the inner area IA located inward of the end area EA of the surface SF of the substrate W in the radial direction RD as described with reference to FIG. 6. This is because the prediction values of the thicknesses after processing in the inner area IA of the substrate W exhibit a more characteristic distribution than the prediction values of the thicknesses after processing in the end area EA of the substrate W.

Next, the thickness predicting section 211 will be described in detail with reference to FIGS. 4 and 8. As illustrated in FIG. 4, the thickness predicting section 211 calculates a prediction thickness information piece PTn of the substrate W based on the measurement thickness information MG of the substrate W, the target thickness value TG of the substrate W, and an actually measured processing amount information piece (also referred to below as actually measured processing amount information piece EMn) contained in the actual measurement processing amount table 231. "n" in "EMn" represents an integer of at least 1.

The actually measured processing amount information piece EMn contains processing amounts at a plurality of points located on a substrate (also referred to below as "substrate WA") in a radial direction RD of the substrate WA that are obtained by actual measurement in advance the substrate WA in the radial direction RD of the substrate WA. The actual measurement is done in advance. The processing amount at each point indicates a processing amount at the point by processing with the processing liquid. The specifying the substrate WA is the same as the specifying the substrate W that is the processing target. That is, the composition and size of the substrate WA are the same as the composition and size of the substrate W that is the processing target.

Figure 8:
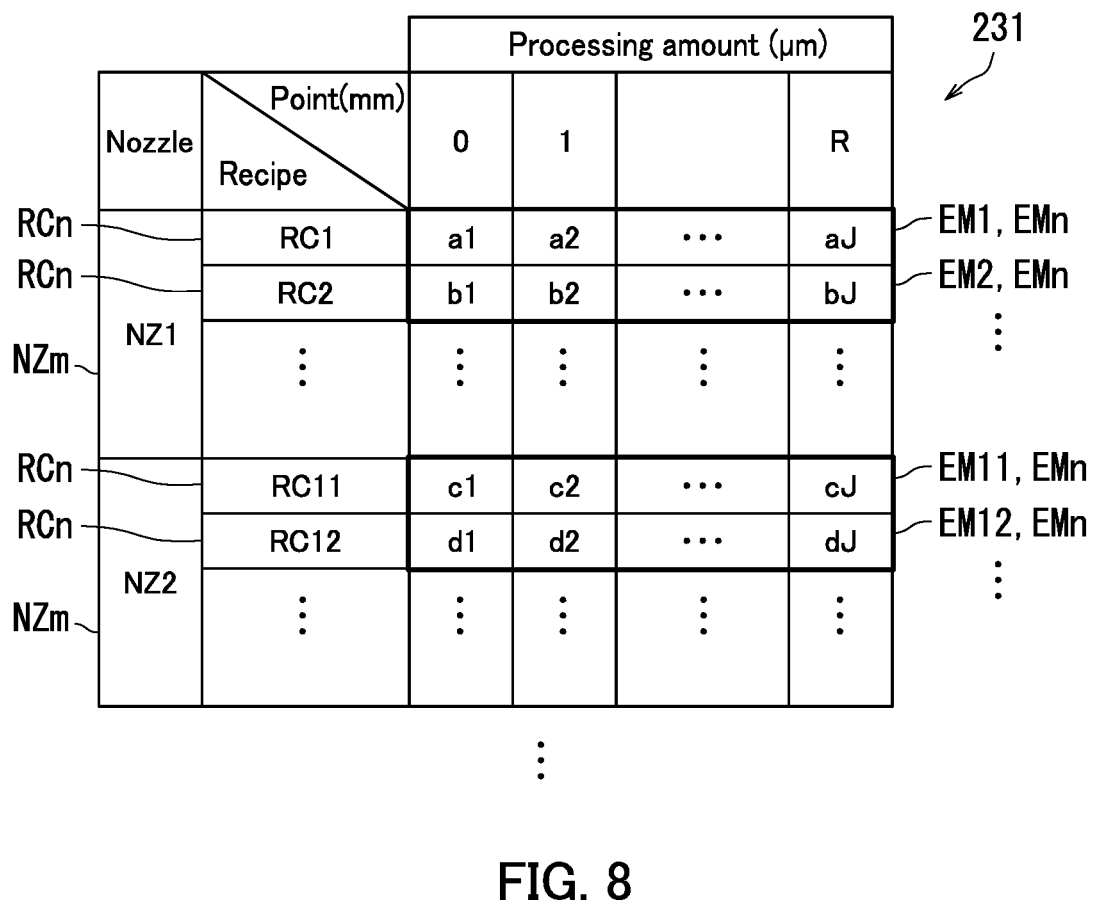

FIG. 8 is a diagram illustrating the actual measurement processing amount table 231 stored in the storage 23 illustrated in FIG. 4. As illustrated in FIG. 8, the actual measurement processing amount table 231 contains a plurality of actually measured processing amount information pieces EMn (EM1, EM2, . . . ). In the actual measurement processing amount table 231, the actually measured processing amount information pieces EMn (EM1, EM2, . . . ) that mutually differ from each other are associated with the recipe information pieces RCn (RC1, RC2, . . . ) that mutually differ from each other. Specifically, the actually measured processing amount information pieces EMn (EM1, EM2, . . . ) are each associated with identification information of a corresponding one of the recipe information pieces RCn (RC1, Rc2, . . . ).

In the example illustrated in FIG. 8, each actually measured processing amount information piece EMn indicates processing amounts actually measured at respective points (specifically, J points) located on the substrate WA in the radial direction RD. J represents an integer of at least 2. The "points" in the actual measurement processing amount table 231 each are a point (mm) on the substrate WA from a center CT of the substrate WA in the radial direction RD of the substrate WA. The "processing amount" in the actual measurement processing amount table 231 is a processing amount (μm) actually measured at each "point" on the substrate WA. In the present embodiment, the "points" located on the substrate WA in the radial direction RD are spaced at regular intervals in the radial direction RD of the substrate WA.

The processing amount at each point on the substrate WA contained in an actually measured processing amount information piece EMn is a processing amount at the point on the substrate WA when the substrate WA is processed according to a recipe information piece RCn of the recipe information pieces RCn that is associated with the actually measured processing amount information piece EMn. For example, processing amounts a1 to aJ at respective points on the substrate WA that are indicted by the actually measured processing amount information piece EM1 is processing amounts at the points on the substrate WA when the substrate WA is processed according to the recipe information piece RC1 associated with the actually measured processing amount information piece EM1. Note that the actually measured processing amount information piece EM2 contains processing amounts b1 to bJ in FIG. 8, for example.

Note that the processing amount at each point on the substrate WA contained in an actually measured processing amount information piece EMn is actually measured after the substrate WA is processed by executing the scanning processing for a predetermined execution time. In this case, the "predetermined execution time" may be the same as or different from "processing execution time" contained in the recipe information piece RC1.

As has been described so far with reference to FIGS. 4 and 8, the thickness predicting section 211 calculates the prediction thickness information pieces PTn of the substrate W based on the actually measured processing amount information pieces EMn in the present embodiment. In the above configuration, the prediction thickness information pieces PTn can be highly accurate.

In particular, the actual measurement processing amount table 231 contains a plurality of actually measured processing amount information pieces EMn for the nozzle NZ1. That is, the nozzle NZ1 is associated with the actually measured processing amount information pieces EMn in the actual measurement processing amount table 231.

The thickness predicting section 211 calculates a prediction thickness information piece PTn of the substrate W for each of the actually measured processing amount information pieces EMn based on the measurement thickness information MG of the substrate W, the target thickness value TG of the substrate W, and the actually measured processing amount information pieces EMn associated with the nozzle NZ1.

In other words, the thickness predicting section 211 calculates a prediction thickness information piece PTn of the substrate W for each of the recipe information pieces RCn based on the measurement thickness information MG of the substrate W, the target thickness value TG of the substrate W, and the actually measured processing amount information pieces EMn associated with the nozzle NZ1. This is because the recipe information pieces RCn are each associated with a corresponding one of the actually measured processing amount information pieces EMn.

Note that in a case in which the processing apparatus 1 includes a plurality of nozzles NZm, the actual measurement processing amount table 231 contains a plurality of actually measured processing amount information pieces EMn for each of the nozzles NZm. The thickness predicting section 211 selects at least one nozzle NZm from among the nozzles NZm. For example, the thickness predicting section 211 selects one nozzle NZm from among the nozzles NZm. The thickness predicting section 211 calculates a prediction thickness information piece PTn of the substrate W for each of the actually measured processing amount information pieces EMn based on the measurement thickness information MG of the substrate W, the target thickness value TG of the substrate W, and the actually measured processing amount information pieces EMn associated with the selected nozzle NZm Note that the actual measurement processing amount table 231 contains a plurality of actually measured processing amount information pieces EMn (EM11, EM12, . . . ) associated with the nozzle NZ2 in the example illustrated in FIG. 8. For example, the actually measured processing amount information piece EM11 associated with the recipe information piece RC11 contains processing amounts c1 to cJ and the actually measured processing amount information piece EM12 associated with the recipe information piece RC12 contains processing amounts d1 to dJ.

The thickness predicting section 211 will be described next further in detail with reference to FIGS. 4, 8, and 9A to 9C. As illustrated in FIGS. 4 and 8, the thickness predicting section 211 calculates a processing time Tk for each of a plurality of points Lk located on the substrate W in the radial direction RD based on the measurement thickness information MG of the substrate W, the target thickness value TG of the substrate W, and the actually measured processing amount information pieces EMn associated with the nozzle NZ1. Here, the processing time Tk is a processing time when the thickness at a point of the points Lk located on the substrate W in the radial direction RD reaches the target thickness value TG. "k" represents an integer of at least 0.

Specifically, the thickness predicting section 211 calculates processing times Tk when the thicknesses at the respective points Lk on the substrate W reach the target thickness value TG. In formula (1), Mk represents a measurement value of thickness at a point Lk on the substrate W, TG represents the target thickness value of the substrate W, and Ek represents a processing amount at the point Lk on the substrate WA. The measurement value Mk at the point Lk on the substrate W is a measurement value of thickness contained in the measurement thickness information MG. The processing amount Ek at the point Lk on the substrate WA is a processing amount contained in the actually measured processing amount information piece EMn. "k" represents an integer of at least 0. Note that Ek in formula (1) may represent a processing amount per unit time at the point Lk on the substrate WA. In this case, the processing amount contained in the actually measured processing amount information piece EMn is also a processing amount per unit time.

$$Tk=(Mk-TG)/Ek \tag{1}$$

FIG. 9A is a graph representation showing an example of the processing time Tk calculated using formula (1). The horizontal axis indicates the points Lk (e.g., mm) on the substrate W in the radial direction RD of the substrate W from the center CT of the substrate W. This is the same for the horizontal axis in each of FIGS. 9B and 9C described later. The vertical axis indicates the processing time Tk.

As shown in FIG. 9A, the thickness predicting section 211 selects the shortest processing time Tx from among a plurality of processing times Tk calculated for the respective points Lk on the substrate W. In the example shown in FIG. 9A, the shortest processing time Tx is a processing time T2 at a point L2 (=2 mm).

The thickness predicting section 211 calculates a prediction thickness information piece PTn based on the measurement thickness information MG of the substrate W, the actually measured processing amount information pieces EMn associated with the nozzle NZ1, and the shortest processing time Tx.

Specifically, the thickness predicting section 211 calculates prediction values Pk of the thicknesses after processing at the respective points Lk located on the substrate W in the radial direction RD using formula (2). "k" represents an integer of at least 0. The prediction values Pk at the respective points Lk on the substrate W constitute a prediction thickness information piece PTn.

$$Pk=Mk-(Ek\times Tx) \tag{2}$$

FIG. 9B is a graph representation showing prediction values Pk of the thicknesses of the substrate W after processing that are calculated using formula (2). The vertical axis indicates the prediction values Pk of the thicknesses of the substrate W.

In the example shown in FIG. 9B, a prediction value Px (=P2) of thickness at a point L2 (=2 mm) among the prediction values Pk matches the target thickness value TG. All the prediction values Pk are equal to or larger than the target thickness value TG. This is because all the prediction values Pk are calculated based on the shortest processing time Tx as indicated by formula (2).

FIG. 9C is a graph representation showing a difference DFk (=Pk−TG) between each prediction value Pk and the target thickness value TG. "k" represents an integer of at least 0. The vertical axis indicates the difference DFk. As shown in FIG. 9C, the difference DFk is at least 0 at each of the points Lk. In the example shown in FIG. 9C, a difference DF2 is 0 at the point L2 (=2 mm). This is because the processing time T2 at the point L2 (=2 mm) is selected as the shortest processing time Tx.

As has been described so far with reference to FIGS. 9A to 9C, the thickness predicting section 211 calculates a prediction thickness information piece PTn based on the shortest processing time Tx of the processing times Tk in the present embodiment. Accordingly, a prediction value Pk at each point Lk can be calculated within a range in which all the prediction values Pk contained in a prediction thickness information piece PTn falls in a range of equal to or larger than the target thickness value TG. In the above configuration, formation of a portion of the substrate W with a thickness that is less than the target thickness value TG can be inhibited in processing on the substrate W based on a recipe information piece RCn corresponding to a prediction thickness information piece PTn selected by the evaluating section 212. That is, excessive processing on the substrate W can be inhibited.

The prescribed evaluation method performed by the evaluating section 212 will be described next with reference to FIGS. 10A to 12B. The horizontal axis and the vertical axis in FIGS. 10A to 12B are the same as the horizontal axis and the vertical axis in FIG. 6, respectively. Furthermore, "n" represents an integer of at least 1.

The prescribed evaluation method according to the present embodiment is a method for evaluation as to how close a prediction thickness pattern PNn indicated by a prediction thickness information piece PTn is to flat. Specifically, the prescribed evaluation method includes at least one evaluation method of a first evaluation method, a second evaluation method, and a third evaluation method.

The first evaluation method is a method for evaluation as to how close a prediction thickness pattern PNn is to flat using an index indicating the degree of unevenness of the prediction thickness pattern PNn. In the present embodiment, the degree of flatness of the prediction thickness pattern PNn can be easily evaluated by the first evaluation method in view of the "degree of unevenness of the prediction thickness pattern PNn". The first evaluation method includes at least one method of a first method, a second method, a third method, and a fourth method. The first to fourth methods will be described later.

The second evaluation method is a method for evaluation as to how close a prediction thickness pattern PNn is to flat using an index that is based on the number of prediction values, of the prediction values constituting a prediction thickness pattern PNn, close to the target thickness value TG of the substrate W. In the present embodiment, the degree of flatness of the prediction thickness pattern PNn can be easily evaluated by the second evaluation method in view of "the number of prediction values of the thicknesses close to the target thickness value TG of the substrate W". The second evaluation method includes at least one method of a first method, and a second method. The first and second methods will be described later.

The third evaluation method is a method for evaluation as to how close a prediction thickness pattern PNn is to flat using an index indicating how close an inclination of the prediction thickness pattern PNn is to zero. In the present embodiment, the degree of flatness of the prediction thickness pattern PNn can be easily evaluated by the third evaluation method in view of "how close the inclination of the prediction thickness pattern PNn to zero". The third evaluation method includes at least one method of a first method and a second method. The first and second methods will be described later.

The first to fourth methods of the first evaluation method will be described first with reference to FIGS. 10A to 10D.

FIG. 10A is a diagram explaining the first method of the first evaluation method. The graph representation shown in FIG. 10A indicates a first evaluation straight line Va and a prediction thickness pattern PNn indicated by a prediction thickness information piece PTn. The first evaluation straight line Va is a straight line tangent to the prediction thickness pattern PNn from a side larger than the prediction thickness pattern PNn. That is, the first evaluation straight line Va is a straight line passing through a convex point A1 and a convex point A2 oriented in a direction in which the prediction value of the thickness increases.

The first method of the first evaluation method is a method for evaluation as to how close the prediction thickness pattern PNn is to flat using as an index differences df that are values that are obtained by subtracting prediction values constituting the prediction thickness pattern PNn from respective values on the first evaluation straight line Va. Specifically, the differences df are each calculated for a corresponding one of points located on the substrate W in the radial direction RD in the first method. How close the prediction thickness pattern PNn is to flat is determined using as an index a maximum difference Qa among the differences df corresponding to the respective points on the substrate W. A smaller maximum difference Qa indicates that the prediction thickness pattern PNn is closer to flat.

Specifically, the evaluating section 212 calculates a first evaluation straight line Va, differences df, and a maximum difference Qa for each of the prediction thickness patterns PNn indicated by a corresponding one of the prediction thickness information pieces PTn. The evaluating section 212 specifies the smallest maximum difference Qa from among the maximum differences Qa corresponding to the respective prediction thickness patterns PNn. Furthermore, the evaluating section 212 selects a prediction thickness information piece PTn indicating a prediction thickness pattern PNn corresponding to the smallest maximum difference Qa from among the prediction thickness information pieces PTn.

As has been described with reference to FIG. 10A, each prediction thickness pattern PNn can be easily and accurately evaluated based on the first evaluation straight line Va in the first method of the first evaluation method according to the present embodiment.

FIG. 10B is a diagram explaining the second method of the first evaluation method. The graph representation shown in FIG. 10B indicates a prediction thickness pattern PNn and a second evaluation straight line Vb. The second evaluation straight line Vb is a straight line tangent to the prediction thickness pattern PNn from a side smaller than the prediction thickness pattern PNn. That is, the second evaluation straight line Vb is a straight line passing through a convex point A3 and a convex point A4 oriented in a direction in which the prediction value of the thickness decreases.

The second method of the first evaluation method is a method for evaluation as to how close the prediction thickness pattern PNn is to flat using as an index differences df that are values obtained by subtracting respective values on the second evaluation straight line Vb from the prediction values constituting the prediction pattern PNn. Specifically, the differences df are calculated for respective points located on the substrate W in the radial direction RD in the second method. How close the prediction thickness pattern PNn is to flat is determined using a maximum difference Qb as an index among the differences df corresponding to the respective points on the substrate W. A smaller maximum difference Qb indicates that the prediction thickness pattern PNn is closer to flat.

Specifically, the evaluating section 212 calculates a second evaluation straight line Vb, differences df, and a maximum difference Qb for each of the prediction thickness patterns PNn indicated by a corresponding one of the prediction thickness information pieces PTn. Furthermore, the evaluating section 212 selects a prediction thickness information piece PTn indicating a prediction thickness pattern PNn corresponding to the smallest maximum difference Qb from among the prediction thickness information pieces PTn in a manner similar to the first method of the first evaluation method.

As has been described with reference to FIG. 10B, each prediction thickness pattern PNn can be easily and accurately evaluated based on the second evaluation straight line Vb in the second method of the first evaluation method according to the present embodiment.

FIG. 10C is a diagram illustrating the third method of the first evaluation method. The graph representation shown in FIG. 10C indicates a prediction thickness pattern PNn and a third evaluation straight line Vc. The third evaluation straight line Vc is an approximate straight line of the prediction thickness pattern PNn obtained by the least-squares method.

The third method of the first evaluation method is a method for evaluation as to how close the prediction thickness pattern PNn is to flat using as an index differences df that are values obtained by subtracting respective values on the third evaluation straight line Vc from the prediction values constituting the prediction thickness pattern PNn. Specifically, a first difference Qc and a second difference Qd are calculated in the third method. Here, the first difference Qc is a value obtained by subtracting a corresponding value on the third evaluation straight line Vc from a maximum value of prediction values of thicknesses constituting the prediction thickness pattern PNn, and the second difference Wd is a value obtained by subtracting a corresponding value on the third evaluation straight line VC from a minimum prediction value constituting the prediction thickness pattern PNn. How close the prediction thickness pattern PNn is to flat is determined using as an index a sum SM of the absolute value of the first difference Qc and the absolute value of the second difference Qd. A smaller sum SM indicates that the prediction thickness pattern PNn is closer to flat.

Specifically, the evaluating section 212 calculates a third evaluation straight line Vc, a first difference Qc, a second difference Qd, and a sum SM for each of the prediction thickness patterns PNn indicated by a corresponding one of the prediction thickness information pieces PTn. The evaluating section 212 specifies the smallest sum SM from among the sums SM corresponding to the respective prediction thickness patterns PNn. Furthermore, the evaluating section 212 selects a prediction thickness information piece PTn indicating a prediction thickness pattern PNn corresponding to the smallest sum SM from among the prediction thickness information pieces PTn.

As has been described with reference to FIG. 10C, each prediction thickness pattern PNn can be easily and accurately evaluated based on the third evaluation straight line Vc in the third method of the first evaluation method according to the present embodiment.

FIG. 10D is a diagram explaining the fourth method of the first evaluation method. The graph representation shown in FIG. 10D indicates a prediction thickness pattern PNn and a fourth evaluation straight line Vd. The fourth evaluation straight line Vd is a straight line indicating the target thickness value TG of the substrate W.

The fourth method of the first evaluation method is a method for evaluation as to how close the prediction thickness pattern PNn is to flat using as an index differences df that are values obtained by subtracting respective values on the fourth evaluation straight line Vd from the prediction values constituting the prediction thickness pattern PNn. Specifically, the differences df are each calculated for a corresponding one of points located on the substrate W in the radial direction RD in the fourth method. How close the prediction thickness pattern PNn is to flat is evaluated using as an index a maximum difference Qe among the differences df. A smaller maximum difference Qe indicates that the prediction thickness pattern PNn is closer to flat.

Specifically, the evaluating section 212 calculates a fourth evaluation straight line Vd, differences df, and a maximum difference Qe for each of the prediction thickness patterns PNn indicated by a corresponding one of the prediction thickness information pieces PTn. The evaluating section 212 specifies a smallest maximum difference Qe from among the maximum differences Qe corresponding to the respective prediction thickness patterns PNn. Furthermore, the evaluating section 212 selects a prediction thickness information piece PTn indicating a prediction thickness pattern PNn corresponding to the smallest maximum difference Qe from among the prediction thickness information pieces PTn.

As has been described with reference to FIG. 10D, each prediction thickness pattern PNn can be easily and accurately evaluated based on the fourth evaluation straight line Vd in the fourth method of the first evaluation method according to the present embodiment.

The first and second methods of the second evaluation method will be described next with reference to FIGS. 11A and 11B.

Figure 11A:
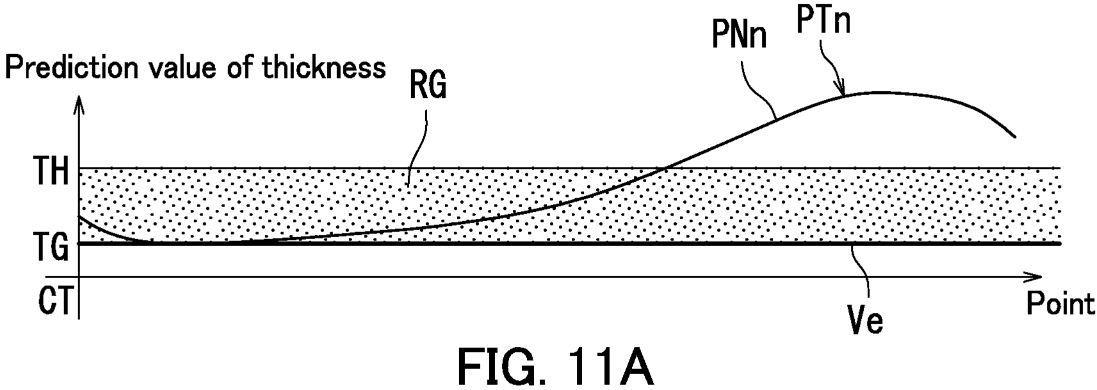
FIG. 11A is a diagram explaining a first method of a second evaluation method in the embodiment.

FIG. 11A is a diagram explaining the first method of the second evaluation method. The graph representation shown in FIG. 11A indicates a prediction thickness pattern PNn, a fifth evaluation straight line Ve, and a tolerable range RG. The fifth evaluation straight line Ve is a straight line indicating the target thickness value TG of the substrate W. The tolerable range RG is a range of unevenness that is tolerable for the substrate W. Specifically, the tolerable range RG includes an upper limit TH and a target thickness value TG that is a lower limit.

The first method of the second evaluation method is a method for evaluation as to how close the prediction thickness pattern PNn is to flat using as an index the number NM of prediction values, of the prediction values constituting the prediction thickness pattern PNn, present in the tolerable range RG including the fifth evaluation straight line Ve. A larger number NM of the prediction values present in the tolerable range RG indicates that the prediction thickness pattern PNn is closer to flat.

Specifically, the evaluating section 212 counts the number NM of the prediction values present in the tolerable range RG for each of the prediction thickness information pieces PTn indicated by a corresponding one of the prediction thickness information pieces PTn to obtain a count information piece indicating the number NM. The evaluating section 212 specifies a count information piece indicating the largest number NM from among count information pieces corresponding to the respective prediction thickness patterns PNn. Furthermore, the evaluating section 212 selects a prediction thickness information piece PTn indicating a prediction thickness pattern PNn corresponding to the count information piece indicating the largest number NM from among the prediction thickness information pieces PTn.

As has been described with reference to FIG. 11A, each prediction thickness pattern PNn can be easily and accurately evaluated based on the tolerable range RG including the fifth evaluation straight line Ve in the first method of the second evaluation method according to the present embodiment.

Figure 11B:
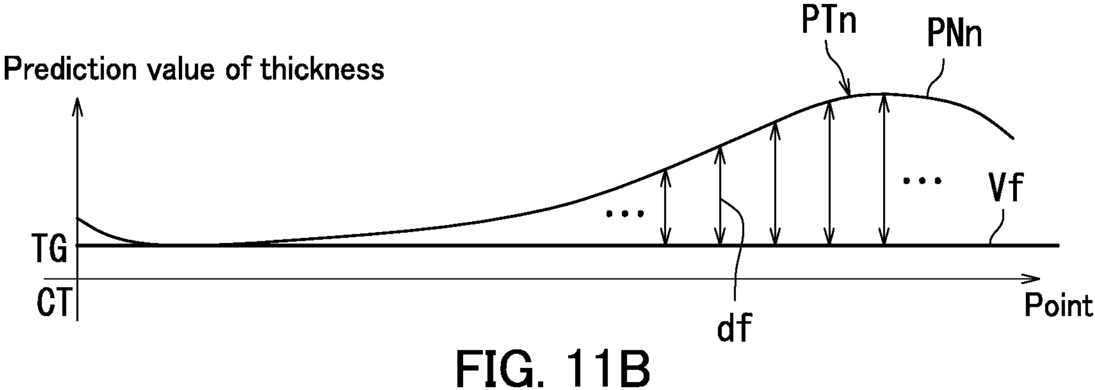
FIG. 11B is a diagram explaining a second method of the second evaluation method.

FIG. 11B is a diagram explaining the second method of the second evaluation method. The graph representation shown in FIG. 11B indicates a prediction thickness pattern PNn and a sixth evaluation straight line Vf. The sixth evaluation straight line Vf is a straight line indicating the target thickness value TG of the substrate W.

The second method of the second evaluation method is a method for evaluation as to how close the prediction thickness pattern PNn is to flat using as an index differences df that are values obtained by subtracting values on the sixth evaluation straight line Vf from respective prediction values constituting the prediction thickness pattern PNn. Specifically, the differences df are each calculated for a corresponding one of points located on the substrate W in the radial direction RD in the second method. An average value AV of the differences df corresponding to the respective points on the substrate W is calculated. A smaller average value AV indicates that the prediction thickness pattern PNn is closer to flat.

Specifically, the evaluating section 212 calculates differences df and an average value AV for each of the prediction thickness patterns PNn indicated by a corresponding one of the prediction thickness information pieces PTn. The evaluating section 212 specifies the smallest average value AV from among the average values AV corresponding to the respective prediction thickness patterns PNn. Furthermore, the evaluating section 212 selects a prediction thickness information piece PTn indicating a prediction thickness pattern PNn corresponding to the smallest average value AV from among the prediction thickness information pieces PTn.

As has been described with reference to FIG. 11B, each prediction thickness pattern PNn can be easily and accurately evaluated based on the sixth evaluation straight line Vf in the second method of the second evaluation method according to the present embodiment.

The first and second methods of the third evaluation method will be described next with reference to FIGS. 12A and 12B.

Figure 12A:
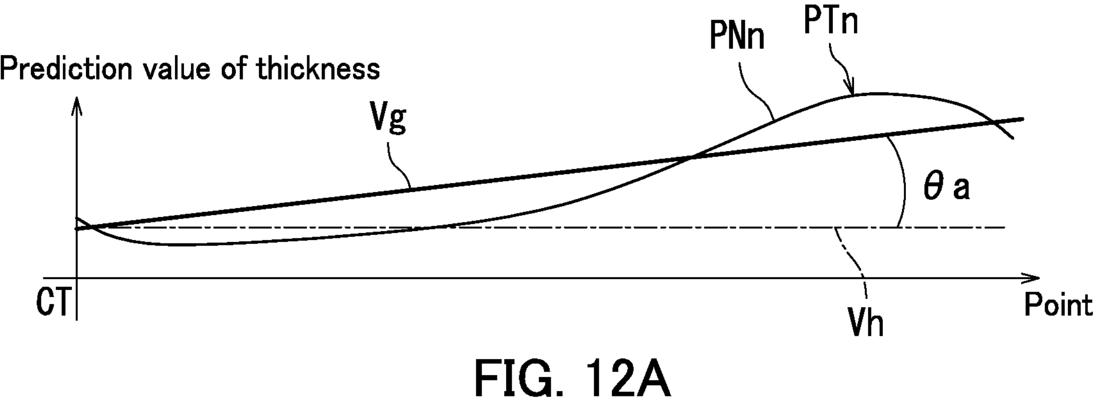
FIG. 12A is a diagram explaining a first method of a third evaluation method in the embodiment.

FIG. 12A is a diagram explaining the first method of the third evaluation method. The graph representation shown in FIG. 12A indicates a prediction thickness pattern PNn, a seventh evaluation straight line Vg, and an eighth evaluation straight line Vh. The seventh evaluation straight line Vg is an approximate straight line of the prediction thickness pattern PNn obtained by the least-squares method. The eighth evaluation straight line Vh is a straight line indicating a constant value.

The first method of the third evaluation method is a method for evaluation as to how close the prediction thickness pattern PNn is to flat using as an index an inclination of the seventh evaluation straight line Vg relative to the eighth evaluation straight line Vh. Specifically, in the first method, how close the prediction thickness pattern PNn is to flat is determined using as an index an inclination angle θa indicating the inclination of the seventh evaluation straight line Vg relative to the eighth evaluation straight line Vh. A smaller inclination angle θa indicates that the prediction thickness pattern PNn is closer to flat. In this case, no particular limitations are placed on the expression form of the inclination angle θa.

Specifically, the evaluating section 212 calculates a seventh evaluation straight line Vg and an inclination angle θa for each of the prediction thickness patterns PNn indicated by a corresponding one of the prediction thickness information pieces PTn. The evaluating section 212 specifies the smallest inclination angle θa from among the inclination angles θa corresponding to the respective prediction thickness patterns PNn. Furthermore, the evaluating section 212 selects a prediction thickness information piece PTn indicating a prediction thickness pattern PNn corresponding to the smallest inclination angle θa from among the prediction thickness information pieces PTn.

As has been described with reference to FIG. 12A, each prediction thickness pattern PNn can be easily and accurately evaluated based on the seventh evaluation straight line Vg and the eighth evaluation straight line Vh in the first method of the third evaluation method according to the present embodiment.

Figure 12B:
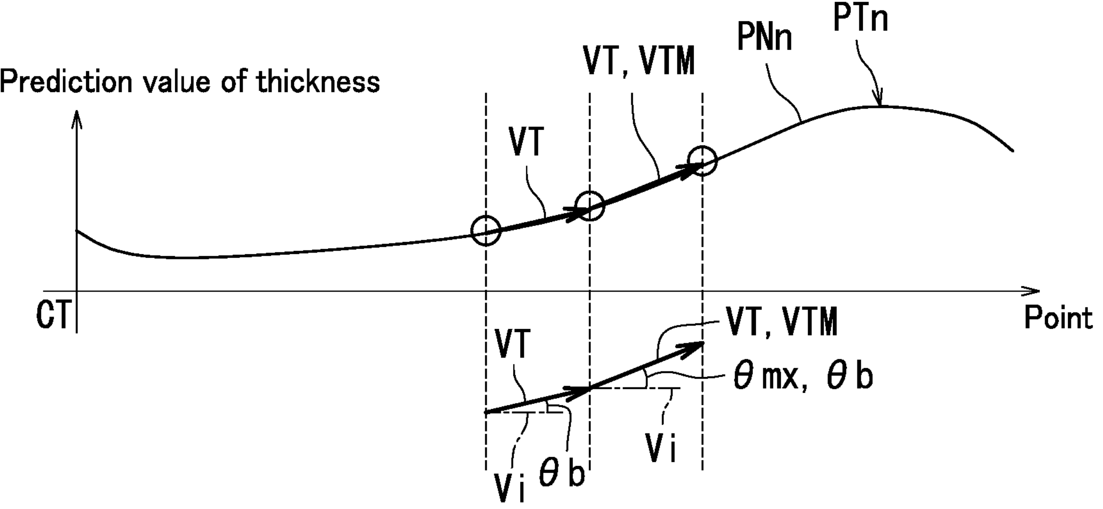
FIG. 12B is a diagram explaining a second method of the third evaluation method.

FIG. 12B is a diagram explaining the second method of the third evaluation method. The graph representation shown in FIG. 12B indicates a prediction thickness pattern PNn, a plurality of evaluation vectors VT, and a ninth evaluation straight line Vi. The evaluation vectors VT each indicate an inclination of the prediction thickness pattern PNn at a corresponding one of points located on the substrate W in the radial direction RD. The ninth evaluation straight line Vi is any straight line with an inclination of zero.

The second method of the third evaluation method is a method for evaluation as to how close the prediction thickness pattern PNn is to flat using as an index an inclination of the prediction thickness pattern PNn at each of the points located on the substrate W in the radial direction RD. Specifically, evaluation vectors VT at the points located on the substrate W in the radial direction RD are calculated for the prediction values of thicknesses at the respective points. Each of the evaluation vectors VT orients from one to the other of adjacent two prediction values. The evaluation vector VT starts at one of the adjacent two prediction values as a starting point and ends at the other of the adjacent two prediction values as an end point. The inclination of the evaluation vector VT is indicated by an inclination angle θb of the evaluation vector VT relative to the ninth evaluation straight line Vi. No particular limitations are placed on the expression form of the inclination angle θb. How close the prediction thickness pattern PNn is to flat is determined using as an index an evaluation vector VTM with a maximum inclination angle θmx among the evaluation vectors VT. A smaller inclination angle θb indicates that the prediction thickness pattern PNn is closer to flat.

Specifically, the evaluating section 212 calculates evaluation vectors VT, inclination angles θb, and a maximum inclination angle θmx for each of the prediction thickness patterns PNn indicated by a corresponding one of the prediction thickness information pieces PTn. The evaluating section 212 specifies the smallest maximum inclination θmx from among the maximum inclination angels θmx corresponding to the respective prediction thickness patterns PNn. Furthermore, the evaluating section 212 selects a prediction thickness information piece PTn indicating a prediction thickness pattern PNn corresponding to the smallest maximum inclination angle θmx from among the prediction thickness information pieces PTn.

As has been described with reference to FIG. 12B, each prediction thickness pattern PNn can be easily and accurately evaluated based on the evaluation vectors VT in the second method of the third evaluation method according to the present embodiment.

Figure 13:
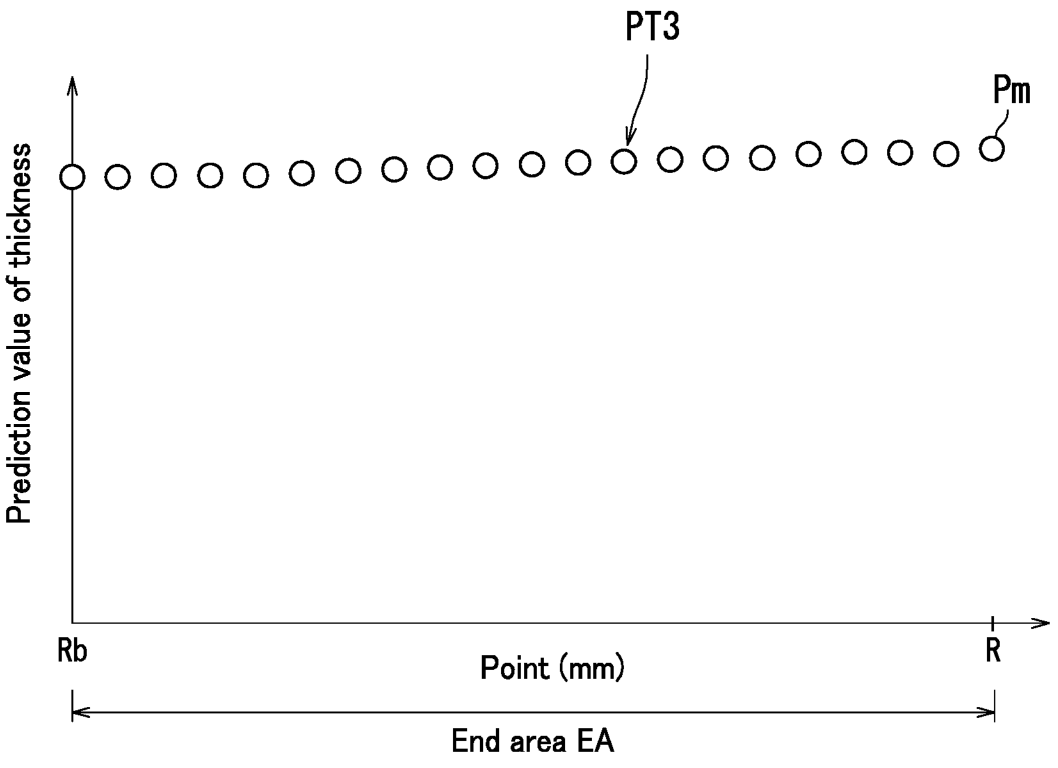
FIG. 13 is a graph representation showing prediction values of thicknesses in an end area of the substrate in the embodiment.

The following describes processing on the end area EA of the substrate W with reference to FIGS. 4, 5, and 13. As illustrated in FIG. 5, it is typical that the end area EA of the substrate W steeply protrudes as compared with the inner area IA thereof. Therefore, separate processing is preferably performed on the end area EA in addition to the scanning processing on the entire area (IA+EA) of the substrate W. The following describes the above preferable example. In this case, an example case will be described in which the evaluating section 212 selects the prediction thickness information piece PT3 from among the prediction thickness information pieces PT1 to PT3 similarly to the case described with reference to FIGS. 6 and 7.

FIG. 13 is a graph representation showing prediction values of the thicknesses after processing on the end area EA of the substrate W. The horizontal axis and the vertical axis in FIG. 13 are the same as the horizontal axis and the vertical axis in FIG. 6, respectively. FIG. 13 indicates the end area EA (Rb [mm] to R [mm]) of the substrate W on the horizontal axis. As illustrated in FIG. 13, the prediction thickness information piece PT3 contains two or more prediction values of the thicknesses in the end area EA of the substrate W.

As illustrated in FIGS. 4 and 13, the end area processing section 214 calculates an end area processing time (also referred to below as "end area processing time TE") based on a maximum value Pm of the prediction values of the thicknesses in the end area EA of the substrate W in the radial direction RD among the prediction values contained in the prediction thickness information piece PT3 selected by the evaluating section 212. The end area processing time TE is a processing time for which processing is performed on the end area EA of the substrate W in a state in which the discharge position of the processing liquid is fixed.

The control section 21 controls the nozzle moving section 9 so that the nozzle NZ1 is located directly above the end area EA of the substrate W (e.g., at the turnaround point TR1 in FIG. 2). In response, the nozzle NZ1 is set stationary directly above the end area EA of the substrate W. The control section 21 controls the valve V1 so that the nozzle NZ1 discharges the processing liquid toward the end area EA of the substrate W for only the end area processing time TE. Accordingly, the nozzle NZ1 stationary directly above the end area EA of the substrate W discharges the processing liquid toward the end area EA of the rotating substrate W for only the end area processing time TE. Therefore, the end area EA of the substrate W can be intensively processed to make the surface SF of the substrate W closer to flat in the present embodiment.

Specifically, the end area processing section 214 calculates an end area processing time TE based on the maximum value Pm in the end area EA of the substrate W, the target thickness value TG of the substrate W, and a processing coefficient PC. The processing coefficient PC is preset in the control section 21, and indicates a processing amount of a substrate with the processing liquid per unit time. Accordingly, the end area processing time TE can be easily calculated by using the processing coefficient PC in the present embodiment. More specifically, the end area processing section 214 calculates the end area processing time TE using formula (3).

$$TE=(Pm-TG)/PC \quad (3)$$

Figure 14:
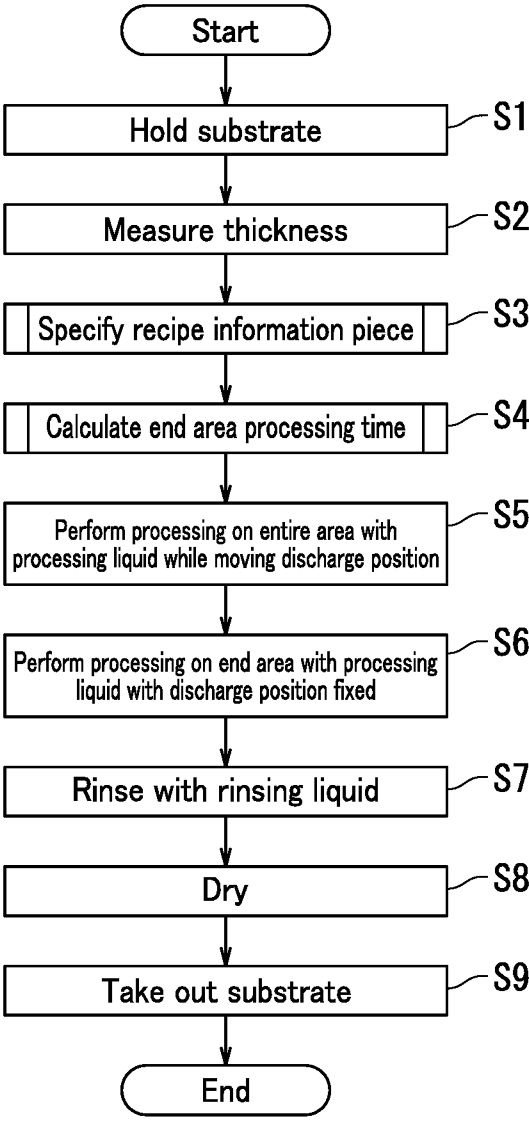
FIG. 14 is a flowchart depicting a substrate processing method according to the embodiment.

With reference to FIGS. 4 and 14 to 17, a processing condition specifying method and a substrate processing method according to an embodiment of the present invention will be described next. FIG. 14 is a flowchart depicting the substrate processing method according to the present embodiment. As depicted in FIG. 14, the substrate processing method includes Steps S1 to S9. The substrate processing method is implemented by the substrate processing apparatus 100 for substrates W one at a time. Steps S3 and S4 constitutes the processing condition specifying method according to the present embodiment.

In Step S1, the control section 21 of the substrate processing apparatus 100 controls the spin chuck 3 to hold the substrate W as illustrated in FIGS. 4 and 14. In response, the spin chuck 3 holds the substrate W.

Next, in Step S2, the control section 21 controls the thickness measuring section 15 to measure the thickness of the substrate W. In response, the thickness measuring section 15 measures the thickness of the substrate at points located on the substrate W in the radial direction RD before processing with the processing liquid. The thickness measuring section 15 outputs to the control section 21 the measurement thickness information MG containing measurement values of thicknesses at the respective points on the substrate W.

Next, in Step S3, the control section 21 specifies from among the recipe information pieces RCn a recipe information piece RCn usable when processing is performed on the substrate W while the discharge position of the processing liquid is moved in the radial direction RD of the substrate W.

Next, in Step S4, the control section 21 calculates an end area processing time TE for which processing is performed on the end area EA of the substrate W.

Next, in Step S5, the control section 21 controls the valve V1 and the nozzle moving section 9 so that the nozzle NZ1 performs the scanning processing on the substrate W based on the recipe information piece RCn specified in Step S3. In response, the nozzle NZ1 performs processing with the processing liquid on the entire area (inner area IA+end area EA) of the substrate W while the discharge position of the processing liquid is moved in the radial direction RD of the substrate W. That is, the nozzle NZ1 discharges the processing liquid toward the entire area of the substrate W.

Next, in Step S6, the control section 21 controls the valve V1 and the nozzle moving section 9 so that the nozzle NZ1 performs processing on the end area EA of the substrate W with the discharge position of the processing liquid fixed for only the end area processing time TE calculated in Step S4. In response, the nozzle NZ1 performs processing on the end area EA of the substrate W for only the end area processing time TE in a state in which the discharge position of the processing liquid is fixed. That is, the nozzle NZ1 kept stationary discharges the processing liquid toward the end area EA of the substrate W for only the end area processing time TE.

Next, in step S7, the control section 21 controls the valve V2 so that the nozzle 11 discharges the rinsing liquid toward the substrate W. In response, the nozzle 11 discharges the rinsing liquid.

Next, in Step S8, the control section 21 controls the spin motor 5 so that the substrate W is rotated. In response, the spin motor 5 rotates the spin chuck 3 to rotate the substrate W. Rotation of the substrate W dries the substrate W.

Next, in Step S9, the control section 21 controls a transport robot so as to take the substrate W out of the chamber 2. In response, the transport robot takes the substrate W out of the chamber 2. After Step S9, the processing according to the substrate processing method ends.

In a substrate product production method according to the present embodiment, a substrate product that is the substrate W after processing is produced by processing the substrate W according to the substrate processing method including Steps S1 to S9. The computer program 232 illustrated in FIG. 4 causes the controller 19 to execute the substrate processing method including Steps S1 to S9. In addition, the computer program 232 illustrated in FIG. 4 may cause the controller 19 to execute the processing condition specifying method including Steps S3 and S4. The controller 19 corresponds to an example of a "computer".

Note that Step S6 may be executed before Step S5. Furthermore, the nozzle NZ2 different from the nozzle NZ1 used in Step S5 may be used in Step S6. In addition, the substrate processing method may not include Steps S4 and S6.

Step S3 in FIG. 14 will be described next with reference to FIGS. 4 and 15. FIG. 15 is a flowchart depicting Step S3 in FIG. 14. As depicted in FIG. 15, Steps S3 includes Steps S31 to S33.

In Step S31, the thickness predicting section 211 of the control section 21 calculates prediction thickness information pieces PTn each containing prediction values of the thicknesses after processing at points located on the substrate W in the radial direction RD for each of the recipe information pieces RCn based on the measurement thickness information MG containing measurement values of thicknesses at the respective points as depicted in FIGS. 4 and 15. That is, the thickness predicting section 211 calculates a plurality of prediction thickness information pieces PTn. The measurement value contained in the measurement thickness information MG indicate the thickness of the substrate W measured in the radial direction RD of the substrate W before processing on the substrate W with the processing liquid.

Specifically, in Step S31, the thickness predicting section 211 calculates prediction thickness information pieces PTn each containing prediction values of the thicknesses after processing at each point from the center CT to the edge EG of the substrate W based on the measurement thickness information MG of the substrate W, the target thickness value TG of the substrate W, and a corresponding actually measured processing amount information piece EMn.

Next, in Step S32, the evaluating section 212 of the control section 21 evaluates the prediction thickness information pieces PTn calculated for the respective recipe information pieces RCn according to the prescribed evaluation method, and selects a prediction thickness information piece PTn from among the prediction thickness information pieces PTn. In this case, the evaluating section 212 may evaluate the prediction thickness information pieces PTn according to one method of the first to fourth methods of the first evaluation method included in the prescribed evaluation method, the first and second methods of the second evaluation method included in the prescribed evaluation method, and the first and second methods of the third evaluation method included in the prescribed evaluation method, or may evaluate the prediction thickness information pieces PTn according to two or more of the methods in combination.

Next, in Step S33, the specifying section 213 of the control section 21 specifies a recipe information piece RCn corresponding to the prediction thickness information piece PTn selected in Step S32. After Step S33, processing of specifying a recipe information piece RCn ends and the routine proceeds to Step S4 in FIG. 14.

Step S31 in FIG. 15 will be described next with reference to FIGS. 4 and 16. FIG. 16 is a flowchart depicting Step S31 in FIG. 15. As depicted in FIG. 16, Steps S31 includes Steps S311 to S314.

In Step S311, the thickness predicting section 211 calculates, for each of points located on the substrate W in the radial direction RD, a processing time Tk when the thickness at the point on the substrate W reaches the target thickness value TG based on the measurement thickness information MG of the substrate W, the target thickness value TG of the substrate W, and the actually measured processing amount information piece EMn as depicted in FIGS. 4 and 16. Specifically, the thickness predicting section 211 calculates the processing times Tk based on the aforementioned formula (1).

Next, in Step S312, the thickness predicting section 211 selects the shortest processing time Tx from among the processing times Tk calculated for the respective points located on the substrate W in the radial direction RD.

Next, in Step S313, the thickness predicting section 211 calculates a prediction thickness information piece PTn based on the measurement thickness information MG of the substrate W, the actually measured processing amount information piece EMn, and the shortest processing time Tx. Specifically, the thickness predicting section 211 calculates the prediction thickness information piece PTn (specifically, a plurality of prediction values Pk) based on the aforementioned formula (2).

Next, in Step S314, the thickness predicting section 211 determines whether or not the processing in Steps S33 to S313 on every actually measured processing amount information piece EMn associated with the nozzle NZ1 ends.

If a negative determination is made (No) in Step S314, the routine proceeds to Step S311.

If an affirmative determination is made (Yes) in step S314, processing of calculating prediction thickness information pieces PTn ends and the routine proceeds to Step S32 in FIG. 15.

Figure 17:
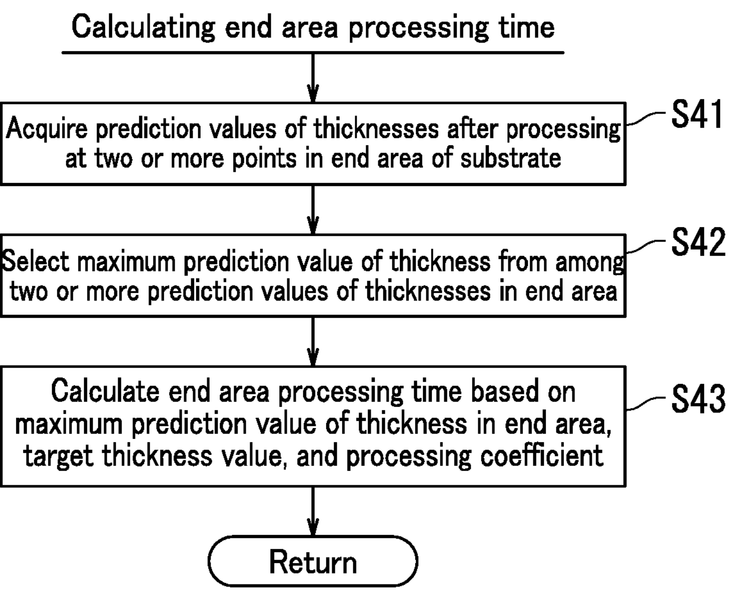
FIG. 17 is a flowchart depicting Step S4 in FIG. 14.

Step S4 in FIG. 14 will be described next with reference to FIGS. 4 and 17. FIG. 17 is a flowchart depicting Step S4 in FIG. 14. As depicted in FIG. 17, Step S4 includes Steps S41 to S43.

In Step S41, the end area processing section 214 of the control section 21 acquires prediction values of the thicknesses after processing at two or more points in the end area EA of the substrate W from among the prediction values of the thicknesses after processing contained in the prediction thickness information piece PTn selected in Step S32 of FIG. 15 as illustrated in FIGS. 4 and 17.

Next, in Step S42, the end area processing section 214 selects a maximum value Pm from among the prediction values of the thicknesses after processing at the two or more points in the end area EA of the substrate W acquired in Step S41.

Next, in Step S43, the end area processing section 214 calculates an end area processing time TE based on the maximum value Pm of the prediction values of the thicknesses in the end area EA of the substrate W that has been selected in Step S42, the target thickness value TG of the substrate W, and the processing coefficient PC. Specifically, the end area processing section 214 calculates the end area processing time TE using the aforementioned formula (3). After Step S43, processing of calculating an end area processing time TE ends and the routine proceeds to Step S5 in FIG. 14.

An embodiment of the present invention has been described so far with reference to the accompanying drawings. However, the present invention is not limited to the above embodiment and may be implemented in various manners within a scope not departing from the gist thereof. Elements of configuration described in the above embodiment may be altered as appropriate. For example, a certain element of configuration among all elements of configuration indicated in a certain embodiment may be added to elements of configurations in another embodiment. Alternatively or additionally, some of all elements of configuration indicated in a certain embodiment may be omitted from the embodiment.

The drawings schematically illustrate elements of configuration in order to facilitate understanding. Properties such as thickness, length, number, intervals of each element of configuration illustrated in the drawings may differ from actual properties thereof in order to facilitate preparation of the drawings. Furthermore, each element of configuration indicated in the above embodiment is an example and not a particular limitation. Various alterations may be made so long as there is no substantial deviation from the effects of the present invention.

(1) The substrate W is a bare substrate in the embodiment described with reference to FIGS. 1 to 17, but may be a substrate subjected to film formation.

(2) In a case in which the processing with the processing liquid is etching in the embodiment with reference to FIGS. 1 to 17, the term "processing liquid" may be read as "etching solution" and the term "processing amount" may be read as "etching amount".

(3) The processing apparatus 1 illustrated in FIG. 1 may not include the thickness measuring section 15 and the probe moving section 17. In this case, the thickness of the substrate W is measured by a thickness measuring section 15 and a probe moving section 17 provided outside the processing apparatus 1. Furthermore, the substrate processing apparatus 100 illustrated in FIG. 1 may not include the thickness measuring section 15 and the probe moving section 17. In this case, the thickness of the substrate W is measured by a thickness measuring section 15 and a probe moving section 17 provided outside the substrate processing apparatus 100. That is, no particular limitations are placed on a site where the thickness of the substrate W is measured so long as the thickness of the substrate W can be measured before processing.

INDUSTRIAL APPLICABILITY

The present invention relates to a processing condition specifying method, a substrate processing method, a substrate product production method, a computer program, a storage medium, a processing condition specifying device, and a substrate processing apparatus, and has industrial applicability.

REFERENCE SIGNS LIST

- 1 processing apparatus
- 19 controller (processing condition specifying device, computer)
- 23 storage (storage medium)
- 100 substrate processing apparatus

211 thickness predicting section

212 evaluating section

213 specifying section

214 end area processing section

232 computer program

W substrate

The invention claimed is:

1. A substrate processing method, comprising:

measuring a thickness of a target substrate, before performing an etching processing on the target substrate, to acquire measurement thickness information containing measurement values of thicknesses measured at a plurality of points located on the target substrate in a radial direction of the target substrate, the etching processing being a processing to be performed on the target substrate while a discharge position of an etching liquid is moved in the radial direction of the target substrate;

calculating a prediction thickness information piece for each of a plurality of processing conditions based on the measurement thickness information, the prediction thickness information piece containing prediction values of thicknesses after the etching processing at the respective points on the target substrate;

evaluating according to a prescribed evaluation method the prediction thickness information pieces each calculated for a corresponding one of the processing conditions and selecting a prediction thickness information piece from among the prediction thickness information pieces, the prescribed evaluation method being a method for evaluation as to how close a prediction thickness pattern indicated by the prediction thickness information piece is to flat;

specifying a processing condition, of the processing conditions, corresponding to the selected prediction thickness information piece; and performing, based on the specified processing condition, the etching processing on the target substrate with the etching liquid while moving the discharge position of the etching liquid in the radial direction of the target substrate.

2. The substrate processing method according to claim 1, further comprising calculating an end area processing time based on, of the prediction values contained in the selected prediction thickness information piece, a maximum value of prediction values of thicknesses in an end area of the target substrate in the radial direction, wherein the end area processing time indicates a processing time for which the etching processing is performed on the end area of the target substrate in a state in which the discharge position of the etching liquid is fixed.

3. The substrate processing method according to claim 2, wherein in the calculating an end area processing time, the end area processing time is calculated based on the maximum value of the prediction values in the end area of the target substrate, a target thickness value of the target substrate, and a processing coefficient, and the processing coefficient is preset and indicates an etching amount of a substrate with the etching liquid per unit time.

4. The substrate processing method according to claim 1, wherein in the calculating a prediction thickness information piece, the prediction thickness information pieces are calculated based on the measurement thickness information of the target substrate, a target thickness value of the target substrate, and an actually measured etching amount information containing etching amounts at a plurality of points located on a substrate in a radial direction of the substrate, the etching amounts being obtained by actual measurement in the radial direction of the substrate, the actual measurement being done in advance, and the etching amounts contained in the actually measured etching amount information each indicate an etching amount in processing the substrate according to a processing condition, of the processing conditions, associated with the actually measured etching amount information.

5. The substrate processing method according to claim 4, wherein the calculating a prediction thickness information piece includes:

calculating a processing time for each of the points on the target substrate based on the measurement thickness information of the target substrate, the target thickness value of the target substrate, and the actually measured etching amount information, the processing time being a processing time when a thickness at each of the points on the target substrate reaches the target thickness value;

selecting a shortest processing time from among the processing times each calculated for a corresponding one of the points on the target substrate; and calculating the prediction thickness information piece based on the measurement thickness information of the target substrate, the actually measured etching amount information, and the shortest processing time.

6. The substrate processing method according to claim 1, wherein in the selecting a prediction thickness information piece, the prediction thickness information pieces are evaluated using prediction values of the thicknesses after the etching processing at two or more points in an inner area of a surface of the target substrate, the inner area being located inward of an end area of the surface of the target substrate in the radial direction of the target substrate.

7. The substrate processing method according to claim 1, wherein the prediction thickness pattern indicates a distribution of the prediction values of the thicknesses of the target substrate in the radial direction of the target substrate, the prescribed evaluation method includes at least one evaluation method of a first evaluation method, a second evaluation method, and a third evaluation method, the first evaluation method is a method for evaluation as to how close the prediction thickness pattern is to flat using an index indicating a degree of unevenness of the prediction thickness pattern, the second evaluation method is a method for evaluation as to how close the prediction thickness pattern is to flat using an index that is based on the number of prediction values, of the prediction values constituting the prediction thickness pattern, close to a target thickness value of the target substrate, and the third evaluation method is a method for evaluation as to how close the prediction thickness pattern is to flat using an index indicating how close an inclination of the prediction thickness pattern to zero.

8. The substrate processing method according to claim 7, wherein the first evaluation method includes at least one method of a first method, a second method, a third method, and a fourth method, the first method of the first evaluation method is a method for evaluation as to how close the prediction thickness pattern is to flat using as the index differences that are values obtained by subtracting the prediction values constituting the prediction thickness pattern from respective values on a first evaluation straight line, the first evaluation straight line is a straight line tangent to the prediction thickness pattern from a side larger than the prediction thickness pattern, the second method of the first evaluation method is a method for evaluation as to how close the prediction thickness pattern is to flat using as the index differences that are values obtained by subtracting respective values on a second evaluation straight line from the prediction values constituting the prediction thickness pattern, the second evaluation straight line is a straight line tangent to the prediction thickness pattern from a side smaller than the prediction thickness pattern, the third method of the first evaluation method is a method for evaluation as to how close the prediction thickness pattern is to flat using as the index differences that are values obtained by subtracting respective values on a third evaluation straight line from the prediction values constituting the prediction thickness pattern, the third evaluation straight line is an approximate straight line of the prediction thickness pattern obtained by a least-squares method, the fourth method of the first evaluation method is a method for evaluation as to how close the prediction thickness pattern is to flat using as the index differences that are values obtained by subtracting respective values on a fourth evaluation straight line from the prediction values constituting the prediction thickness pattern, and the fourth evaluation straight line is a straight line indicating a target thickness value of the target substrate.

9. The substrate processing method according to claim 7, wherein the second evaluation method includes at least one method of a first method and a second method, the first method of the second evaluation method is a method for evaluation as to how close the prediction thickness pattern is to flat using as the index the number of prediction values, of the prediction values constituting the prediction thickness pattern, present in a tolerable range including a fifth evaluation straight line, the fifth evaluation straight line is a straight line indicating the target thickness value of the target substrate, the second method of the second evaluation method is a method for evaluation as to how close the prediction thickness pattern is to flat using as the index differences that are values obtained by subtracting respective values on a sixth evaluation straight line from the prediction values constituting the prediction thickness pattern, and the sixth evaluation straight line is a straight line indicating the target thickness value of the target substrate.

10. The substrate processing method according to claim 7, wherein the third evaluation method includes at least one method of a first method and a second method, the first method of the third evaluation method is a method for evaluation as to how close the prediction thickness pattern is to flat using as the index an inclination of a seventh evaluation straight line relative to an eighth evaluation straight line, the seventh evaluation straight line is an approximate straight line of the prediction thickness pattern obtained by a least-squares method, the eighth evaluation straight line is a straight line indicating a constant value, and the second method of the third evaluation method is a method for evaluation as to how close the prediction thickness pattern is to flat using as the index an inclination of the prediction thickness pattern at each of the points located on the target substrate in the radial direction of the target substrate.

11. A substrate product production method for producing a substrate product, wherein the substrate product is produced by performing the etching processing on the target substrate according to the substrate processing method according to claim 1, the substrate product being the target substrate after the etching processing.

12. A substrate processing apparatus, comprising:

a thickness measuring section configured to measure a thickness of a target substrate, before performing an etching processing on the target substrate, to acquire measurement thickness information containing measurement values of thicknesses measured at a plurality of points located on the target substrate in a radial direction of the target substrate, the etching processing being a processing to be performed on the target substrate while a discharge position of an etching liquid is moved in the radial direction of the target substrate;

a thickness predicting section configured to calculate a prediction thickness information piece for each of a plurality of processing conditions based on the measurement thickness information, the prediction thickness information piece containing prediction values of thicknesses after the etching processing at the respective points on the target substrate;

an evaluating section configured to evaluate according to a prescribed evaluation method the prediction thickness information pieces each calculated for a corresponding one of the processing conditions and select a prediction thickness information piece from among the prediction thickness information pieces, the prescribed evaluation method being a method for evaluation as to how close a prediction thickness pattern indicated by the prediction thickness information piece is to flat;

a specifying section configured to specify a processing condition, of the processing conditions, corresponding to the selected prediction thickness information piece; and a processing apparatus configured to process the target substrate with the etching liquid while moving the discharge position of the etching liquid in the radial direction of the target substrate based on the processing condition specified by the processing condition specifying section.

* * * * *